US011424126B2

United States Patent
Kamimura et al.

(10) Patent No.: US 11,424,126 B2
(45) Date of Patent: Aug. 23, 2022

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventors: Kazuki Kamimura, Matsumoto (JP); Motoyoshi Kubouchi, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 17/235,330

(22) Filed: Apr. 20, 2021

(65) Prior Publication Data
US 2021/0398811 A1    Dec. 23, 2021

(30) Foreign Application Priority Data

Jun. 17, 2020  (JP) .............................. JP2020-104316
Dec. 21, 2020  (JP) .............................. JP2020-211843

(51) Int. Cl.
*H01L 29/739* (2006.01)
*H01L 29/06* (2006.01)
(Continued)

(52) U.S. Cl.
CPC .......... *H01L 21/221* (2013.01); *H01L 21/268* (2013.01); *H01L 21/26513* (2013.01);
(Continued)

(58) Field of Classification Search
CPC ............. H01L 21/221; H01L 21/26513; H01L 21/268; H01L 21/8222; H01L 27/0664;
(Continued)

(56) References Cited

U.S. PATENT DOCUMENTS

| 10,651,299 B2 * | 5/2020 | Naito ................. H01L 29/0696 |
| 2016/0218101 A1 | 7/2016 | Gejo |
| 2018/0012762 A1 | 1/2018 | Mukai et al. |

FOREIGN PATENT DOCUMENTS

| JP | 2004-363328 A | 12/2004 |
| JP | 2008-004866 A | 1/2008 |

(Continued)

*Primary Examiner* — David Vu
(74) *Attorney, Agent, or Firm* — Rabin & Berdo, P.C.

(57) ABSTRACT

A semiconductor device has transistor portions and diode portions. The transistor portions have a semiconductor substrate of a first conductivity type, a first semiconductor region of a second conductivity type, second semiconductor regions of the first conductivity type, gate insulating films, gate electrodes, a first semiconductor layer of the first conductivity type, a third semiconductor region of the second conductivity type, a first electrode, and a second electrode. The diode portions have the semiconductor substrate, the first semiconductor region, the first semiconductor layer, a fourth semiconductor region of the first conductivity type, the first electrode, and the second electrode. A first depth of the first semiconductor layer from the back surface of the semiconductor substrate in the transistor portions is greater than a second depth of the first semiconductor layer from the back surface of the semiconductor substrate in the diode portions.

11 Claims, 11 Drawing Sheets

(51) Int. Cl.
*H01L 29/66* (2006.01)
*H01L 21/22* (2006.01)
*H01L 27/06* (2006.01)
*H01L 29/10* (2006.01)
*H01L 29/32* (2006.01)
*H01L 21/8222* (2006.01)
*H01L 29/861* (2006.01)
*H01L 21/265* (2006.01)
*H01L 21/268* (2006.01)

(52) U.S. Cl.
CPC ...... *H01L 21/8222* (2013.01); *H01L 27/0664* (2013.01); *H01L 29/0623* (2013.01); *H01L 29/1095* (2013.01); *H01L 29/32* (2013.01); *H01L 29/66136* (2013.01); *H01L 29/66348* (2013.01); *H01L 29/7397* (2013.01); *H01L 29/8613* (2013.01)

(58) Field of Classification Search
CPC . H01L 29/0623; H01L 29/1095; H01L 29/32; H01L 29/66136; H01L 29/66348; H01L 29/7397; H01L 29/8613; H01L 29/0619; H01L 29/0684; H01L 29/0688; H01L 29/66439; H01L 29/407; H01L 29/36; H01L 27/0629; H01L 21/8258; H01L 29/0615; H01L 29/7398
See application file for complete search history.

(56) References Cited

FOREIGN PATENT DOCUMENTS

| | | |
|---|---|---|
| JP | 2016-139719 A | 8/2016 |
| WO | 2017/047285 A1 | 3/2017 |

* cited by examiner

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application Nos. 2020-104316, filed on Jun. 17, 2020, and 2020-211843, filed on Dec. 21, 2020, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Recently, power converting circuits that perform conversion of direct current and alternating current, voltage-current conversion of direct currents or alternating currents, etc. are used in various fields such as industrial machine, railroad car, electric car, and power generation fields. A function of an insulated gate bipolar transistor (IGBT) and a function of a freewheeling diode (FWD) connected in antiparallel to the IGBT are used are used for control.

A reverse conducting IGBT (RC-IGBT) in which the IGBT and the FWD connected in antiparallel to the IGBT are integrated on a single semiconductor substrate is commonly known. In a power semiconductor device such as a RC-IGBT, in an $n^-$-type drift layer, formation of an n-type field stop (FS) layer having an impurity concentration higher than that of the $n^-$-type drift layer is typical.

A method of manufacturing a conventional RC-IGBT having an n-type FS layer is described. FIGS. 26, 27, and 28 are cross-sectional views depicting states of the conventional RC-IGBT having an n-type FS layer during manufacture. First, on a front side of an $n^-$-type semiconductor substrate 118 of a normally used thickness, front device element structures (not depicted) such as MOS gates (insulated gates having a metal, an oxide film, and a semiconductor), an interlayer insulating film, and a front electrode (electrode pad) are formed by a general method. Next, the $n^-$-type semiconductor substrate 118 is ground from a back side thereof to a position of a product thickness for use as a semiconductor device.

Next, an ion implantation 200 of phosphorus (P) or selenium (Se) is performed from the ground back surface of the $n^-$-type semiconductor substrate 118, and an $n^+$-type FS layer 120 is formed in the $n^-$-type semiconductor substrate 118 toward the back surface thereof, spanning an IGBT region and a diode region. The state up to here is depicted in FIG. 26.

Next, the ion implantation 200 of boron (B) is performed from the back surface of the $n^-$-type semiconductor substrate 118, and a $p^+$-type collector region 122 is formed in the $n^-$-type semiconductor substrate 118, at a position shallower from the back surface than is the $n^+$-type FS layer 120, the $p^+$-type collector region 122 spanning the IGBT region and the diode region. The state up to here is depicted in FIG. 27.

Next, a resist mask 201 opened at portions corresponding to the diode region is formed on the back surface of the $n^-$-type semiconductor substrate 118 by photolithography. Next, phosphorus is ion-implanted from the back surface of the $n^-$-type semiconductor substrate 118 using the resist mask 201 as a mask, whereby portions of the $p^+$-type collector region 122 in the $n^-$-type semiconductor substrate 118 at the back surface thereof in the diode region is inverted to an n-type, thereby forming $n^+$-type cathode regions 182. The state up to here is depicted in FIG. 28.

Next, the resist mask 201 is removed by an ashing process. Next, the impurities ion-implanted in the $n^-$-type semiconductor substrate 118 are diffused by a heat treatment. Next, on a front surface of the $n^-$-type semiconductor substrate 118, a polyimide surface protecting film is formed. Next, on the back surface of the semiconductor wafer, a back electrode in contact with the $p^+$-type collector region 122 and the $n^+$-type cathode regions 182 is formed. Thereafter, the $n^-$-type semiconductor substrate 118 is cut (diced) into individual chips, thereby completing the conventional RC-IGBT.

Further, a semiconductor device having a first semiconductor layer of a first conductivity type, provided in a first region; a second semiconductor layer of a second conductivity type, provided in a second region; a fourth semiconductor layer of the second conductivity type, provided on the first semiconductor layer and on the second semiconductor layer; a fifth semiconductor layer of the first conductivity type, provided on the fourth semiconductor layer; a sixth semiconductor layer of the second conductivity type, provided in a portion of the first region on the fifth semiconductor layer; a second electrode provided in the first region; and a third electrode provided in the second region is commonly known and in the semiconductor device, of a distance between a third semiconductor layer and the third electrode and a distance between the fifth semiconductor layer and the third semiconductor layer in the second region, at least one thereof is shorter than a distance between the third semiconductor layer and the second electrode (for example, refer to Japanese Laid-Open Patent Publication No. 2016-139719).

Further, a semiconductor device is commonly known in which an n-type FS layer is configured by a fifth n-type layer formed when proton irradiation is performed multiple times with different ranges from a substrate back side, whereby first to fourth n-type layers of differing depths are formed and thereafter, the protons are activated, helium is irradiated at a position deeper from the substrate back surface than are the ranges of the proton irradiation, lattice defects are induced, and the lattice defect amount is adjusted by a heat treatment (for example, refer to International Publication No. WO 2017/047285).

SUMMARY OF THE INVENTION

According to an embodiment of the invention, a semiconductor device having a transistor portion and a diode portion, includes in the transistor portion: a semiconductor substrate of a first conductivity type, having a first main surface and a second main surface that are opposite to each other; a first semiconductor region of a second conductivity type, provided in the semiconductor substrate, closer to the first main surface than to the second main surface, the first semiconductor region having a first surface and a second surface that are opposite to each other, the second surface of the first semiconductor region being closer to the second main surface than is the first surface of the first semiconductor region; a plurality of second semiconductor regions of the first conductivity type, each selectively provided in the first semiconductor region at the first surface of the first semiconductor region; a gate insulating film having a first surface and a second surface that are opposite to each other, the first surface of the gate insulating film being in contact with the first semiconductor region; a gate electrode provided on the second surface of the gate insulating film; a first semiconductor layer of the first conductivity type, provided in the semiconductor substrate, the first semiconductor layer having a first surface and a second surface that are opposite to each other, the second surface of the first semiconductor layer being closer to the second main surface than is the first surface of the first semiconductor layer; a third semiconductor region of the second conductivity type, provided in the semiconductor substrate at the second main surface of the semiconductor substrate; a first electrode provided on the first surface of the first semiconductor region and surfaces of the second semiconductor regions; and a second electrode provided on a surface of the third semiconductor region; in the diode portion: the semiconductor substrate; the first semiconductor region; the first semiconductor layer; a fourth semiconductor region of the first conductivity type, provided in the semiconductor substrate at the second main surface of the semiconductor substrate; the first electrode provided on the first surface of the first semiconductor region; and the second electrode provided on a surface of the fourth semiconductor region. A first depth of the first semiconductor layer from the second main surface of the semiconductor substrate to the first surface of the first semiconductor layer in the transistor portion is greater than a second depth of the first semiconductor layer from the second main surface of the semiconductor substrate to the first surface of the first semiconductor layer in diode portion.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
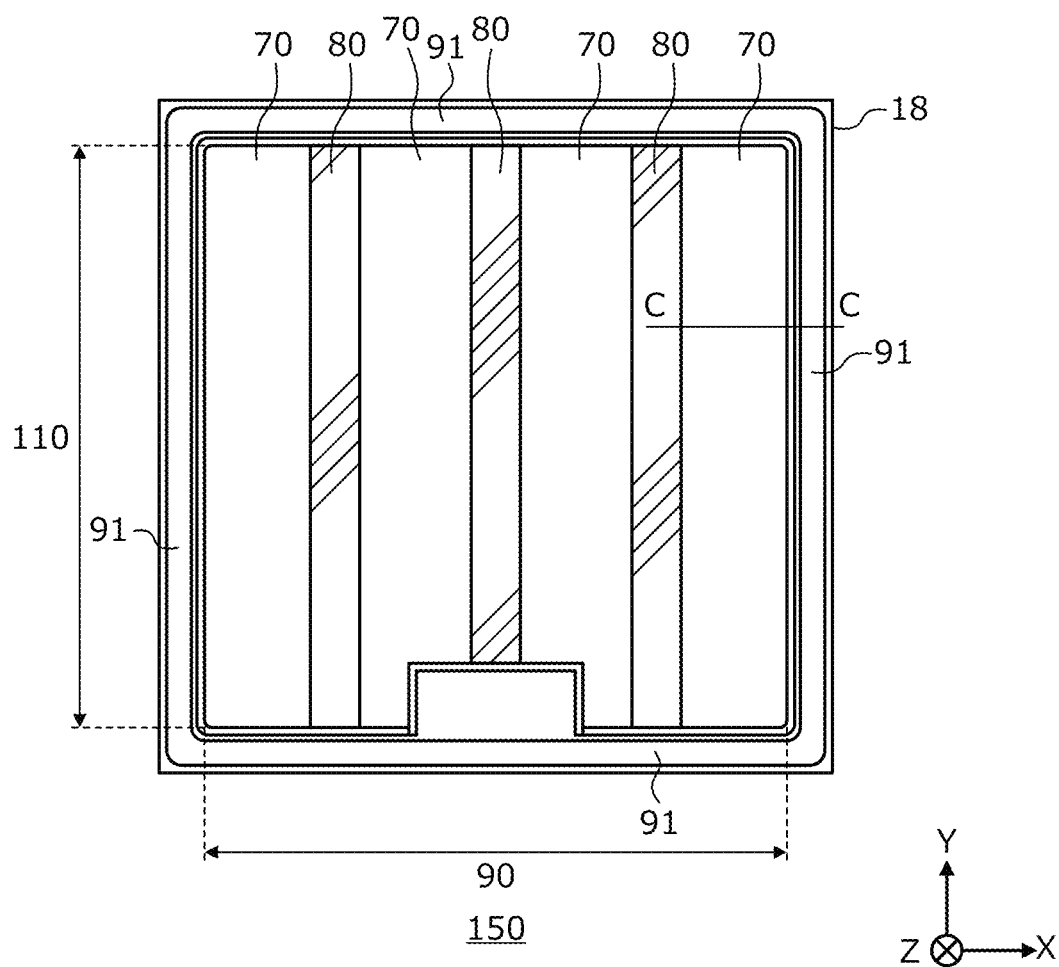
FIG. 1 is a plan view of a structure of a semiconductor device according to a first embodiment.

First, problems associated with the conventional techniques are discussed. When the $n^+$-type FS layer 120 and the $p^+$-type collector region 122 are formed in the order stated, the $n^+$-type FS layer 120 is formed as a layer having a uniform distance from the back surface of the $n^-$-type semiconductor substrate 118. In this instance, a semiconductor device having the same breakdown voltage in the IGBT region and in the diode region is fabricated.

When reverse recovery surge voltage increases due to the switching speed being increased, high voltage is applied to the diode region as compared to the IGBT region. Therefore, when the IGBT region and the diode region have the same breakdown voltage, a problem arises in that the diode region tends to be destroyed first.

Embodiments of a semiconductor device and a method of manufacturing a semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of a first embodiment below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be assumed to be within 5%.

Figure 2:
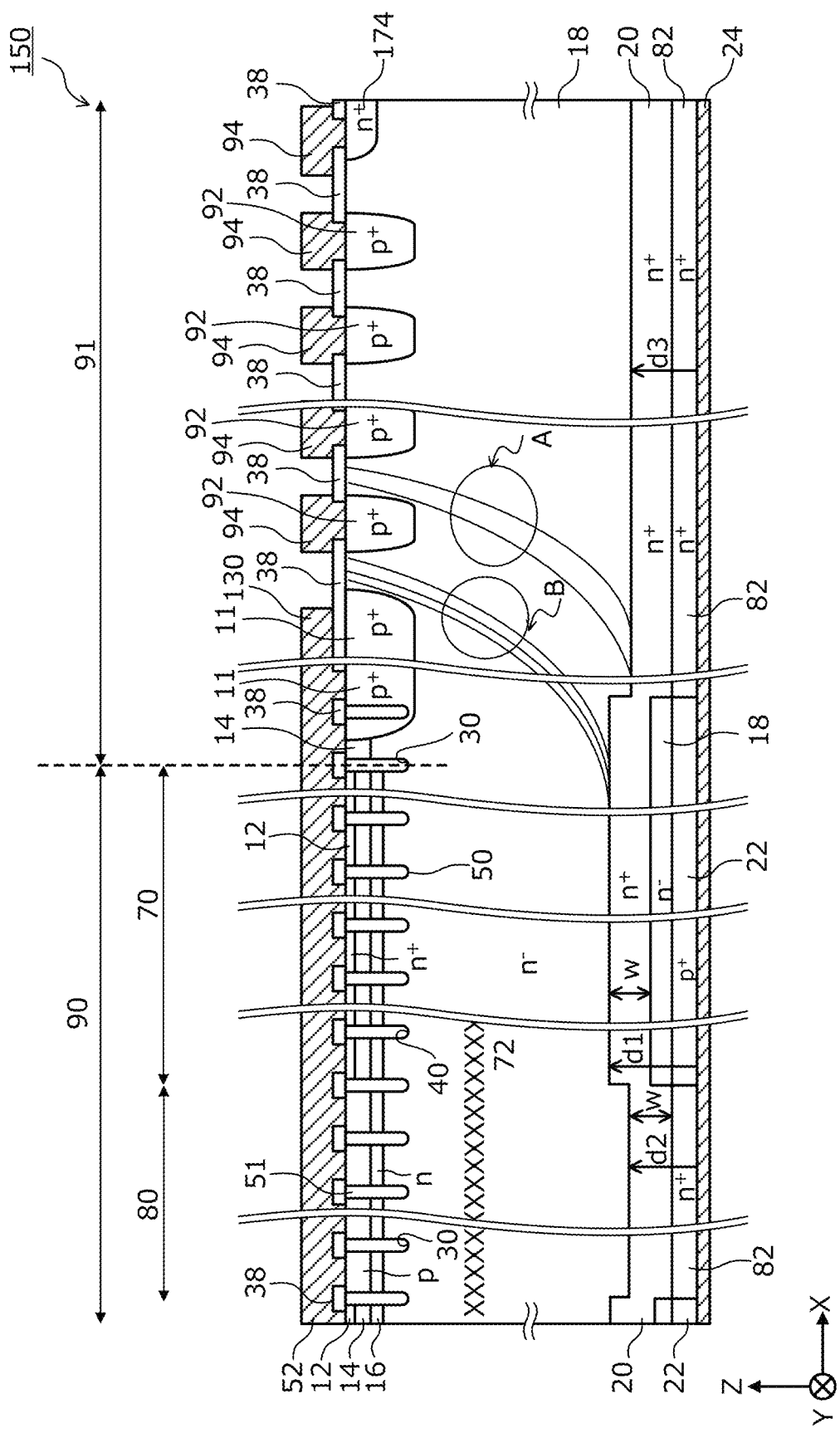
FIG. 2 is a cross-sectional view of the structure of the semiconductor device according to the first embodiment.

A structure of a semiconductor device according to a first embodiment is described taking a RC-IGBT as an example. FIG. 1 is a plan view of the structure of the semiconductor device according to the first embodiment. FIG. 2 is a cross-sectional view of the structure of the semiconductor device according to the first embodiment. The semiconductor device according to the first embodiment depicted in FIGS. 1 and 2 is an RC-IGBT 150 in which an IGBT having a trench gate structure and a diode connected in antiparallel to the IGBT are integrated on a single semiconductor substrate (semiconductor chip).

As depicted in FIG. 1, the RC-IGBT 150 includes an active region 90 and an edge termination region 91 surrounding a periphery of the active region 90. The active region 90 is a region in which current flows during an ON state. The edge termination region 91 includes a voltage withstanding region that mitigates electric field of a semiconductor-base-front-side of a drift region and sustains the breakdown voltage. A border between the active region 90 and the edge termination region 91 is a center of a dummy trench 30 having a later-described n$^-$-type emitter region 12 only on one side or being free of the n$^+$-type emitter region 12 on both sides. On the single semiconductor substrate, in the active region 90, IGBT regions (transistor portions) 70 that are IGBT operating regions and diode regions (diode portions) 80 that are diode operating regions are provided in parallel.

In a surface layer of an n$^-$-type semiconductor substrate (semiconductor substrate of a first conductivity type) 18 at a front surface of the n$^-$-type semiconductor substrate 18 constituting an n$^-$-type drift layer of the active region 90, an n-type accumulation layer 16 may be provided. The n-type accumulation layer 16 is a so-called current spreading layer (CSL) that reduces carrier spreading resistance. On the n-type accumulation layer 16 (in the n$^-$-type semiconductor substrate 18 toward the front surface thereof), a p-type base region (first semiconductor region of a second conductivity type) 14 is provided spanning the IGBT regions 70 and the diode regions 80. The p-type base region 14 functions as p-type anode regions in the diode regions 80. Gate trenches 40 and dummy trenches 30 penetrating through the p-type base region 14 and reaching the n$^-$-type semiconductor substrate 18 are provided. The gate trenches 40 have the n$^+$-type emitter regions 12 provided on both sides thereof; the gate trenches 40 are disposed separated by a predetermined interval, for example, in a striped planar layout in the IGBT regions 70; and the gate trenches 40 divide the p-type base region 14 into multiple regions (mesa portions). In the gate trenches 40, gate insulating films 50 are provided along inner walls of the gate trenches 40, respectively, and on the gate insulating films 50, the gate electrodes 51 are provided, respectively. The dummy trenches 30 are provided at a border between the IGBT regions 70 and the diode regions 80, a border between the IGBT regions 70 and the edge termination region, and in the diode regions 80; the dummy trenches 30 may have a structure similar to that of the gate trenches 40.

In the IGBT regions 70, in the p-type base region 14, n$^+$-type emitter regions (second semiconductor regions of the first conductivity type) 12 are selectively provided in the mesa portions, respectively. The n$^+$-type emitter regions 12 face the gate electrodes 51 with the gate insulating films 50 intervening therebetween, the gate insulating films 50 being disposed on the inner walls of the gate trenches 40. In the diode regions 80, the n$^+$-type emitter regions 12 are not provided in the p-type base region 14. A front electrode (first electrode) 130 is in contact with the n+-type emitter regions 12 via contact holes and is electrically insulated from the gate electrodes 51 by an interlayer insulating film 38. In the n$^+$-type emitter regions 12, openings may be selectively provided, and in the openings, the front electrode 130 and the p-type base region 14 may be electrically connected. The front electrode 130 functions as an emitter electrode 52 in the IGBT regions 70 and functions as an anode electrode in the diode regions 80.

In the n$^-$-type semiconductor substrate 18, near a substrate back surface, an n$^+$-type field stop (FS) layer (first semiconductor layer of the first conductivity type) 20 is provided. The n$^+$-type FS layer 20 has a function of suppressing the spreading of a depletion layer that spreads toward later-described p$^+$-type collector regions 22, from pn junctions between the p-type base region 14 and the n$^-$-type semiconductor substrate 18 during an OFF state. A depth of the n$^+$-type FS layer 20 in the IGBT regions 70 differs from a depth of the n$^+$-type FS layer 20 in the diode regions 80, and the n$^+$-type FS layer 20 has an undulating shape. In general, when an impurity layer is formed at different depths by ion implantation, a deeper portion of the impurity layer thereof tends to have a thicker thickness as compared to a shallower portion of the impurity layer; however, in the IGBT regions 70 and in the diode regions 80, the n$^+$-type FS layer 20 of the semiconductor device according to the first embodiment has a thickness w that is within a range of manufacturing variation.

As depicted in FIG. 2, in the IGBT regions 70, the n$^+$-type FS layer 20 is provided at positions deeper than those in the diode regions 80. The n$^+$-type FS layer 20, as depicted in FIG. 2, may be disposed at substantially a same depth in an entire area of the IGBT regions 70 that extend in a Y-axis direction. Further, the n$^+$-type FS layer 20, as depicted in FIG. 2, may be disposed at substantially a same depth in an entire area of the diode regions 80 that extend in the Y-axis direction. Here, "deep" and "shallow" are with reference to the back surface of the n$^-$-type semiconductor substrate 18; a deep position means that a distance from a back surface of the n$^-$-type semiconductor substrate 18 is long and a shallow position means that a distance from the back surface of the n$^-$-type semiconductor substrate 18 is short. The back surface of the n⁻-type semiconductor substrate 18 is surfaces of the p⁺-type collector regions 22 and surfaces of n⁺-type cathode regions 82, facing a back electrode 24; the p⁺-type collector regions 22 and the n⁻-type cathode regions 82 are provided in the n⁻-type semiconductor substrate 18 at the back surface of the n⁻-type semiconductor substrate 18. In other words, a depth d1 of the n⁺-type FS layer 20 in the IGBT regions 70 is greater than a depth d2 of the n⁺-type FS layer 20 in the diode regions 80 (d1>d2). The depths are lengths from the back surface of the n⁻-type semiconductor substrate 18 to a front surface of the n⁺-type FS layer 20 (surface facing the p-type base region 14). A difference of the depths (d1−d2) may be in a range from 0.5 µm to 3 µm. In the IGBT regions 70, between the n⁺-type FS layer 20 and the p⁺-type collector regions 22, a portion of the n⁻-type semiconductor substrate 18 of a thickness corresponding to the difference of the depths (d1−d2) is present. Due to the portion of the n⁻-type semiconductor substrate 18 being present between the n⁺-type FS layer 20 and the p⁺-type collector regions 22, the n⁺-type FS layer 20 and the p⁺-type collector regions 22 having high impurity concentrations are apart from each other, whereby breakdown voltage of this portion is enhanced. Meanwhile, in the diode regions 80, the n⁺-type FS layer 20 may be provided at the front surface of the n⁺-type cathode regions 82 (surface thereof opposite to that facing the back electrode 24).

As a result, in the diode regions 80, the thickness of the n⁻-type semiconductor substrate 18 that is the drift layer is thick, the depletion layer does not easily reach the back surface of the n⁻-type semiconductor substrate 18, and the breakdown voltage of the diode regions 80 may be increased. For example, when the switching speed is increased, the reverse recovery surge voltage increases and a risk of device element destruction increases; nonetheless, the n⁻-type FS layer 20 of the diode regions 80 is provided at a position shallow from the back surface (distance from the back surface of the n⁻-type semiconductor substrate 18 is short), whereby a sufficient breakdown voltage may be ensured and even when a large reverse recovery surge voltage is applied, device elements are not easily destroyed and the semiconductor device becomes highly reliable.

Further, in the n⁻-type semiconductor substrate 18, in the diode regions 80, at positions shallower from the front surface of the n⁻-type semiconductor substrate 18 than is the n⁺-type FS layer 20, lifetime killer control regions 72 are provided in which lattice defects (indicated by "x"s) such as voids (V) that become lifetime killers are induced by helium (He) irradiation. The lifetime killer control regions 72 may extend to portions of the IGBT regions 70, near borders between the IGBT regions 70 and the diode regions 80. Further, the lifetime killer control regions 72 may extend to a chip end of the edge termination region 91 (end of the edge termination region 91, opposite to an end thereof facing the active region 90). The n⁻-type semiconductor substrate 18 has a carrier concentration that is lower in a portion where the lifetime killer control regions 72 are provided than in other portions thereof. Therefore, in the diode regions 80, the carrier lifetime of the n⁻-type semiconductor substrate 18 is shortened, disappearance of the carriers during reverse recovery of the diode may be accelerated, and reverse recovery loss may be reduced.

In a surface layer of the n⁻-type semiconductor substrate 18 at the back surface of the n⁻-type semiconductor substrate 18, at positions shallower from the back surface of the n⁻-type semiconductor substrate 18 than is the n⁺-type FS layer 20, the p⁺-type collector regions (third semiconductor regions of the second conductivity type) 22 are provided in the IGBT regions 70, and the n⁺-type cathode regions (fourth semiconductor regions of the first conductivity type) 82 are provided in the diode regions 80. The n⁺-type cathode regions 82 are adjacent to the p⁺-type collector regions 22. The back electrode (second electrode) 24 is provided on surfaces of the p⁺-type collector regions 22 and surfaces of the n⁺-type cathode regions 82 (in an entire area of the back surface of the n⁻-type semiconductor substrate). The back electrode 24 functions as a collector electrode in the IGBT regions 70 and functions as a cathode electrode in the diode regions 80.

In the edge termination region 91, a p⁺-type well region 11 is provided near the active region 90. In the edge termination region 91, a guard rings 92 of a p⁺-type and an n⁺-type channel stopper 174 that is in contact with the chip end are provided. Further, the channel stopper may be a p-type. The guard ring 92 may be provided in plural, from a negative side toward a positive side of an X axis direction. FIG. 2 depicts an example in which the guard ring 92 is provided in plural.

The guard rings 92 may be provided in the edge termination region 91 so as to surround a periphery of the active region 90. In an instance in which the guard rings 92 are provided in plural, the guard rings 92 may have a same impurity concentration. Further, field plate electrodes 94 are provided on top surfaces of portions of the interlayer insulating film 38 so as to be in contact with a surface of the n⁺-type channel stopper 174 and surfaces of the guard rings 92.

A back structure of the edge termination region 91 may be such that, similarly to the diode regions 80, the n⁺-type cathode regions 82 are provided and in an entire area of the edge termination region 91, the n⁺-type FS layer 20 is provided at a shallow position. In other words, a depth d3 of the n⁺-type FS layer 20 in the edge termination region 91 is substantially equal the depth d2 of the n⁻-type FS layer 20 in the diode regions 80 (d3≈d2). As depicted in FIG. 2, the n⁺-type FS layer 20 may be provided at a shallow position, at least from the chip end to the p⁺-type well region 11. As a result, a width of electric field widens in the edge termination region 91 as indicated by region A, and the width of electric field narrows in the p⁺-type well region 11 near the active region 90, as indicated by region B. Therefore, avalanche breakdown easily occurs at the p⁺-type well region 11 near the active region 90 and destruction of the edge termination region 91 may be prevented.

Further, in an entire area of the edge termination region 91, from the chip end to the p⁺-type well region 11, the n⁺-type FS layer 20 does not have to be provided at a shallow position. By providing the n⁺-type FS layer 20 at shallow positions where avalanche breakdown easily occurs, the occurrence of avalanche breakdown may be suppressed at these locations.

Figure 3:
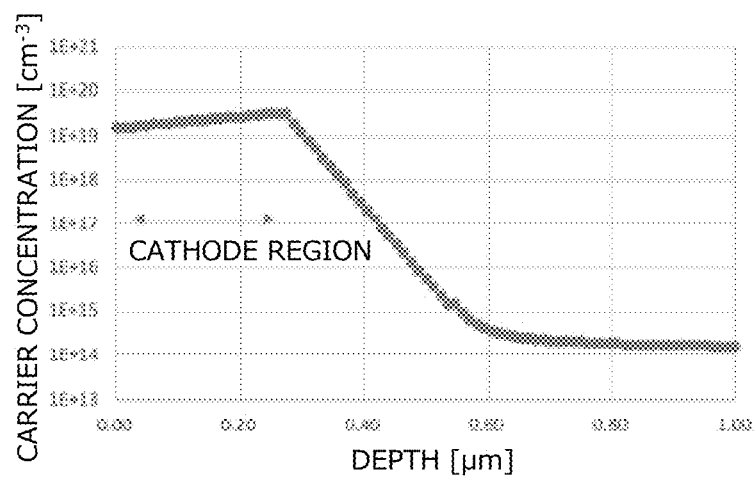
FIG. 3 is a characteristics diagram depicting carrier concentration distribution of cathode regions of the semiconductor device according to the first embodiment.

FIG. 3 is a characteristics diagram depicting carrier concentration distribution of the cathode regions of the semiconductor device according to the first embodiment. In FIG. 3, a vertical axis indicates carrier concentration in units of $cm^{-3}$ and a vertical axis indicates depth from the back surface of the n⁻-type semiconductor substrate 18 in units of µm. FIG. 3 shows results of measurement of carrier concentration by a spreading resistance profiler (SR) technique in an instance in which the n⁺-type cathode regions 82 are formed by an acceleration energy of 110 keV and a dose amount of $3\times10^{15}$ $cm^{-2}$. In FIG. 3, it was found that the n⁺-type cathode regions 82 of about 0.35 µm were formed.

Figure 4:
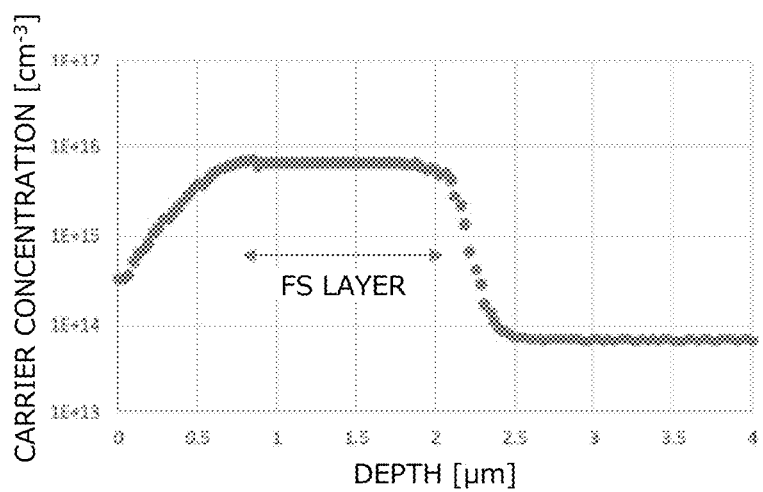
FIG. 4 is a characteristics diagram depicting carrier concentration distribution of a FS layer of the semiconductor device according to the first embodiment.

FIG. 4 is a characteristics diagram depicting carrier concentration distribution of the FS layer of the semiconductor device according to the first embodiment. In FIG. 4, a vertical axis indicates carrier concentration in units of cm$^{-3}$ and a vertical axis indicates depth from the back surface of the n$^-$-type semiconductor substrate 18 in units of μm. FIG. 4 shows results of measurement of carrier concentration by a SR technique in an instance in which the n$^+$-type FS layer 20 is formed by an acceleration energy of 620 keV and a dose amount of 1.7×10$^{12}$ cm$^{-2}$. In FIG. 4, it is found that the n$^+$-type FS layer 20 of about 1.4 μm is formed.

Figure 5:
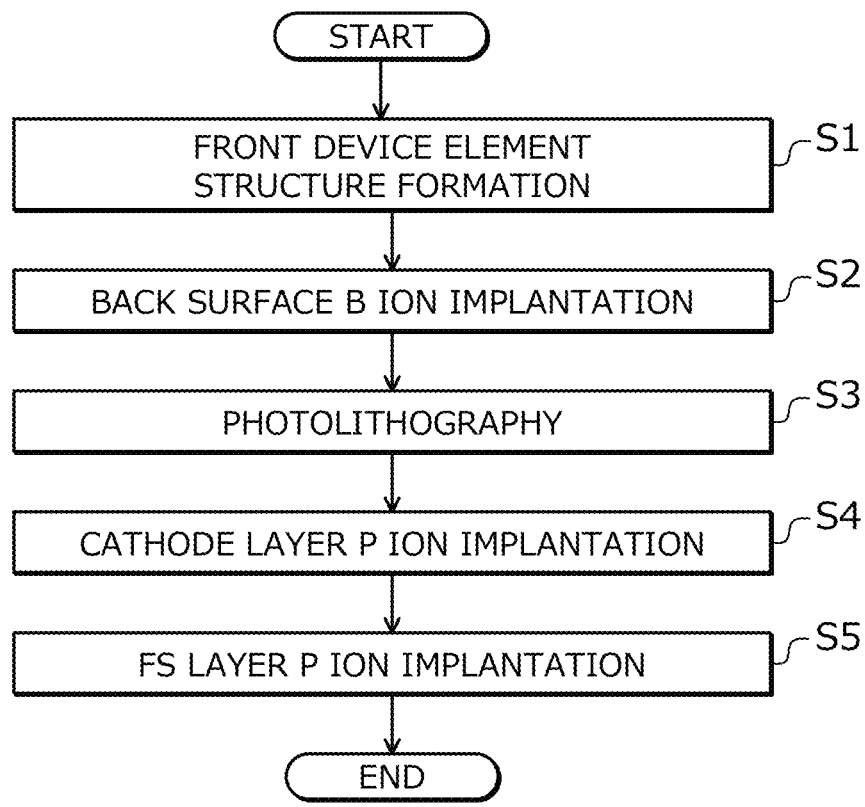
FIG. 5 is a flowchart depicting a method of manufacturing the semiconductor device according to the first embodiment.
Figure 6:
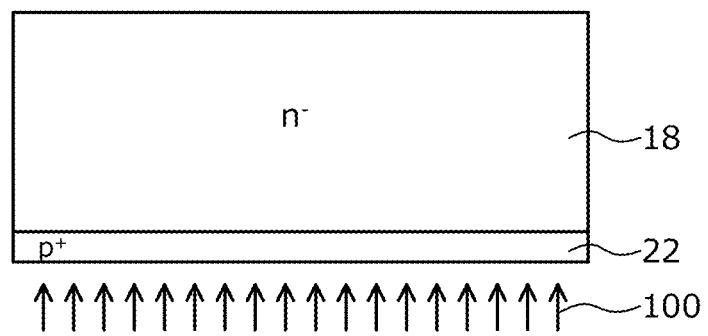
FIG. 6 is a cross-sectional view depicting a state of an active region during manufacture of the semiconductor device according to the first embodiment.
Figure 7:
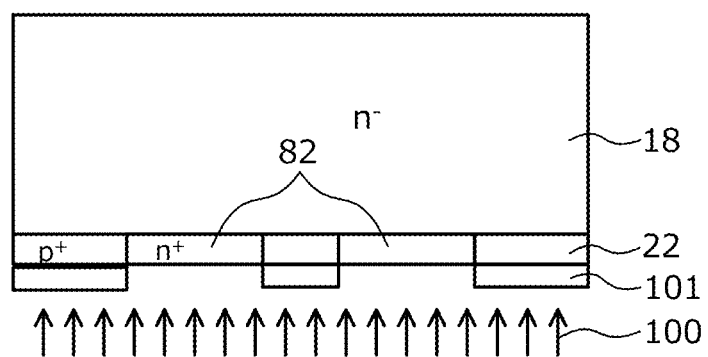
FIG. 7 is a cross-sectional view depicting a state of the active region during manufacture of the semiconductor device according to the first embodiment.
Figure 8:
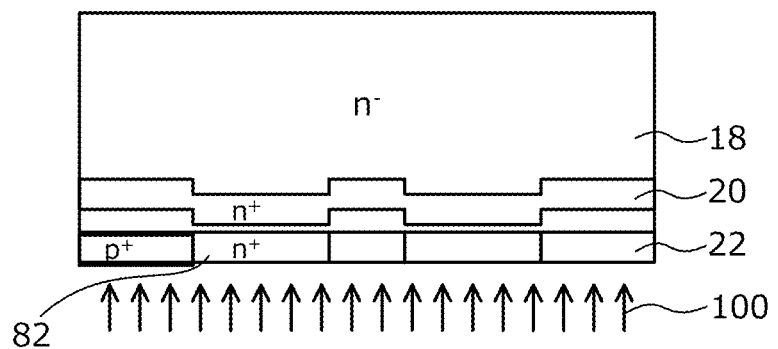
FIG. 8 is a cross-sectional view depicting a state of the active region during manufacture of the semiconductor device according to the first embodiment.

Next, a method of manufacturing the semiconductor device according to the first embodiment is described. FIG. 5 is a flowchart depicting the method of manufacturing the semiconductor device according to the first embodiment. FIGS. 6, 7, and 8 are cross-sectional views of states of the active region 90 during manufacture of the semiconductor device according to the first embodiment. Here, in FIGS. 6 to 8, front device element structures are not depicted.

First, in the n$^-$-type semiconductor substrate 18 constituting an n-type drift layer of the active region 90, the gate trenches 40, the gate insulating films 50, and the gate electrodes 51 are sequentially formed by a general method near the front surface of the n$^-$-type semiconductor substrate 18, whereby the MOS gates are formed. The dummy trenches 30 are further formed similarly to the gate trenches 40, in the n$^-$-type semiconductor substrate 18 constituting the n-type drift layer, near the front surface thereof, in the active region 90 and in the edge termination region 91 near the active region 90. In the n$^-$-type semiconductor substrate 18, at a depth shallower from the front surface of the n$^-$-type semiconductor substrate 18 than are bottoms of the gate trenches 40, the n-type accumulation layer 16 may be formed by epitaxial growth, for example.

Next, in the edge termination region 91, the p$^+$-type well region 11 and the guard rings 92 are selectively formed in a surface layer at the substrate front surface, by ion implantation of a p-type impurity such as boron (B). Next, the n$^-$-type channel stopper 174 is selectively formed in a surface layer at the substrate front surface, by ion implantation of an n-type impurity such as phosphorus (P) or arsenic (As).

Next, in the active region 90 and in the edge termination region 91 closer to the active region 90 than is the p$^+$-type well region 11, the p-type base region 14 is formed at a depth shallower from the front surface of the n$^-$-type semiconductor substrate 18 than is a depth of the bottoms of the gate trenches 40, by ion implantation of a p-type impurity such as boron (B). Alternatively, in an instance of the n-type accumulation layer 16, the p-type base region 14 is formed at a depth shallower from the front surface of the n$^-$-type semiconductor substrate 18 than is a depth of the n-type accumulation layer 16. In the method described above, the p-type base region 14 is formed after the guard rings 92 and the n$^+$-type channel stopper 174 are formed; however, the guard rings 92 and the n$^+$-type channel stopper 174 may be formed after the p-type base region 14 is formed.

Next, by ion implantation of an n-type impurity such as phosphorus (P) or arsenic (As), the n$^+$-type emitter regions 12 are selectively formed in the p-type base region 14 of the IGBT regions 70. Next, the interlayer insulating film 38, for example, a BPSG film, etc. is deposited (formed) so as to cover the gate electrodes 51.

Next, the interlayer insulating film 38 is patterned, forming contact holes therein, the n$^+$-type emitter regions 12 are exposed in the IGBT regions 70, the p-type base region 14 is exposed in the diode regions 80, and the n$^+$-type channel stopper 174, the p$^+$-type well region 11, and the guard rings 92 are exposed in the edge termination region 91. Next, in the contact holes, plug electrodes (not depicted) are formed via a barrier metal (not depicted). Next, for example, by a sputtering technique, the front electrode 130 that covers an entire area of the surface of the interlayer insulating film 38 is formed so as to be in contact with the plug electrodes in the contact holes. In the edge termination region 91 as well, for example, by a sputtering technique, the field plate electrodes 94 that cover portions of the surface of the interlayer insulating film 38 are formed so as to be contact with the plug electrodes in the contact holes. In this manner, the front device element structures of the semiconductor device according to the first embodiment are formed (step S1: first process to fourth process).

Next, the n$^-$-type semiconductor substrate 18 is ground from the back side thereof, to a position corresponding to a product thickness used for the semiconductor device. Next, in an entire area of the back surface of the n$^-$-type semiconductor substrate 18, for example, the ion implantation 100 of a p-type impurity such as boron (B) is performed, thereby forming the p$^+$-type collector regions 22 in a surface layer of the n$^-$-type semiconductor substrate 18, in an entire area of the back surface of the n$^-$-type semiconductor substrate 18 (step S2: fifth process). When there are portions in which the p-type impurity is not implanted such as due to particles, breakdown voltage failures, etc. occur and therefore, the p-type impurity is immediately ion-implanted from a state in which the implantation surface is clean so that the process does not proceed in a state in which the back surface of the n$^-$-type semiconductor substrate 18 is exposed. The state up to here is depicted in FIG. 6.

Next, by photolithography, on the back surface of the n$^-$-type semiconductor substrate 18, a resist mask 101 opened at portions corresponding to the diode regions 80 and the edge termination region 91 is formed (step S3). Next, the ion implantation 100 of an n-type impurity such as, for example, phosphorus (P) is performed using the resist mask 101 as a mask, whereby in the diode regions 80 and the edge termination region 91, the p$^+$-type collector regions 22 in the surface layer of the n$^-$-type semiconductor substrate 18 at the back surface of the n$^-$-type semiconductor substrate 18 are inverted into an n-type, thereby forming the n$^+$-type cathode regions 82 (step S4: sixth process). In this manner, a relaxed field of cathode (RFC) structure in which n$^+$-type regions and p$^+$-type regions are arranged adjacently is formed. The state up to here is depicted in FIG. 7.

Next, the resist mask 101 is removed by an ashing process. Next, in an entire area of the back surface of the n$^-$-type semiconductor substrate 18, the ion implantation 100 of an n-type impurity such as, for example, phosphorus is performed, whereby the n$^+$-type FS layer 20 is formed in the n$^-$-type semiconductor substrate 18 (step S5: the sixth process). The state up to here is depicted in FIG. 8.

Here, before the impurity implanted in the n$^+$-type cathode regions 82 and the p$^+$-type collector regions 22 is activated, the n$^+$-type cathode regions 82 and the p$^+$-type collector regions 22 are excessively ion-implanted. There is a difference in the amount of crystal defects in the n$^+$-type cathode regions 82 and the amount in the p$^+$-type collector regions 22, and since the n$^+$-type cathode regions 82 have more crystal defects, the n-type impurity does not easily pass through the n$^+$-type cathode regions 82. Therefore, in the IGBT regions 70, the n$^-$-type FS layer 20 is formed a position deeper from the back surface of the n$^-$-type semiconductor substrate 18 than are the positions of the diode regions 80 and the n$^+$-type FS layer 20 is formed having an undulating shape. Therefore, in the first embodiment, without an increase in the number of processes as compared conventionally, by a single session of ion implantation, the n$^+$-type FS layer 20 may be formed at a deep position in the IGBT regions 70 and the n$^+$-type FS layer 20 may be formed at a shallow position in the diode regions 80.

In this manner, the ion implantation for forming the n$^+$-type FS layer 20 is performed before the regions having differing amounts of crystal defects are formed and the impurities are activated, without performing annealing. As a result, the n$^+$-type FS layer 20 is formed having an undulating shape. In the method described above, as a method of forming the regions having differing amounts of crystal defects, the n$^+$-type cathode regions 82 and the p$^+$-type collector regions 22 are formed, however, the method is not limited hereto. For example, a noble gas such as argon (Ar) or xenon (Xe), or an element that does not affect electrical characteristics of the substrate such as silicon (Si) may be selectively ion-implanted in the n$^-$-type semiconductor substrate 18 from the back surface thereof, whereby the regions having differing amounts of crystal defects may be formed. In this instance, in the diode regions 80, for example, before argon is implanted and annealing is performed, phosphorus is ion-implanted in an entire area of the back surface of the n$^-$-type semiconductor substrate 18, whereby the n$^+$-type FS layer 20 is formed in the IGBT regions 70 at a position deeper from the back surface of the n$^-$-type semiconductor substrate 18 than is the position at which the n$^+$-type FS layer 20 is formed in the diode regions 80, and the n$^+$-type FS layer 20 is formed having an undulating shape. Further, with consideration of channeling, during ion implantation, by performing the ion implantation from a crystal orientation facilitating channeling, the effect of forming the undulating shape due to differences in the amount of crystal defects becomes prominent, enabling formation of the n$^+$-type FS layer 20 having an undulating shape.

Further, an ion species for forming the n$^+$-type FS layer 20 may be phosphorous, hydrogen, arsenic (As), etc. Of these, phosphorus may be preferable. A reason for this is that by performing the ion implantation for forming the n$^+$-type FS layer 20 using phosphorus, the effect of forming the undulating shape due to differences in the amount of crystal defects becomes prominent and formation of the n$^+$-type FS layer 20 having an undulating shape is facilitated. Hydrogen is a lighter element than phosphorus and therefore, may be implanted deeper and as compared to an instance in which phosphorus is used, formation of the undulating n$^+$-type FS layer 20 at a deeper position is facilitated. Arsenic is a heavier element than phosphorus and therefore, as compared to an instance in which phosphorus is used, the undulating n$^+$-type FS layer 20 is formed at a shallower position by ion implantation requiring greater energy. In addition, while selenium, sulfur, etc. may be used as an ion species, these diffuse easily and therefore, forming the n$^+$-type FS layer 20 to have an undulating shape is difficult.

Further, the RFC structure and the n$^+$-type FS layer 20 may be formed by selectively ion-implanting an n-type impurity, for example, phosphorus (P) or arsenic (As), etc. in the n$^-$-type semiconductor substrate 18 at the back surface thereof, thereby selectively forming the n$^+$-type cathode regions 82 in a surface layer of the n$^-$-type semiconductor substrate 18 at the back surface of the n$^-$-type semiconductor substrate 18 in the diode regions 80 and thereafter, selectively ion-implanting a p-type impurity, for example, boron (B) in the n$^-$-type semiconductor substrate 18 at the back surface thereof, thereby selectively forming the p$^+$-type collector regions 22 in a surface layer at the back surface in the IGBT regions 70 and thereafter, ion-implanting an n-type impurity, thereby forming the n$^+$-type FS layer 20. Phosphorus and arsenic, which are n-type impurities, are prone to crystal defects and have mass numbers that are greater as compared to boron, which is a p-type impurity; therefore, the regions having differing amounts crystal defects may be formed. A sequence in which the n$^+$-type cathode regions 82 and the p$^+$-type collector regions 22 are formed may be suitably changed.

Further, the RFC structure and the n$^+$-type FS layer 20 undulating opposite to the first embodiment may be formed by ion-implanting an n-type impurity in an entire area of the back surface of the n$^-$-type semiconductor substrate 18, thereby forming the n$^+$-type cathode regions 82 in a surface layer of an entire area of the back surface of the n$^-$-type semiconductor substrate 18 and thereafter, selectively ion-implanting a p-type impurity in the n$^-$-type semiconductor substrate 18 at the back surface thereof, thereby inverting the n$^+$-type cathode regions 82 in the IGBT regions 70 to a p-type to form the p$^+$-type collector regions 22 and thereafter, ion-implanting an n-type impurity, thereby forming the n$^+$-type FS layer 20. In other words, in this instance, the n$^+$-type FS layer 20 is formed at a shallower position from the back surface of the n$^-$-type semiconductor substrate 18 in the IGBT regions 70 than in the diode regions 80.

Further, after the resist mask 101 opened at portions corresponding to the IGBT regions 70 is formed on the back surface of the n$^-$-type semiconductor substrate 18 by photolithography and, for example, a p-type impurity is ion-implanted using the resist mask 101 as a mask, thereby selectively forming the p$^+$-type collector regions 22 in a surface layer of the n$^-$-type semiconductor substrate 18 at the back surface thereof, an n-type impurity is ion-implanted in a surface layer of the n$^-$-type semiconductor substrate 18 in an entire area of the back surface of the n$^-$-type semiconductor substrate 18, whereby the n$^+$-type cathode regions 82 are formed without inverting the p$^+$-type collector regions 22 to an n-type and thereafter, an n-type impurity is ion-implanted, thereby forming the n$^+$-type FS layer 20. By this method as well, the RFC structure may be formed and the n$^-$-type FS layer 20 undulating opposite to the first embodiment may be formed. In other words, the n$^+$-type FS layer 20 is formed at a shallower position from the back surface of the n$^-$-type semiconductor substrate 18 in the IGBT regions 70 than in the diode regions 80.

Next, the n$^+$-type cathode regions 82, the p$^+$-type collector regions 22, and the n$^+$-type FS layer 20 are activated by a heat treatment (annealing). A temperature suitable for activation of the n$^+$-type FS layer 20 and a temperature suitable for activation of a layer formed by another impurity differ and therefore, activation of the n$^+$-type FS layer 20 is performed separately from activation of the n$^+$-type cathode regions 82 and the p$^+$-type collector regions 22. For example, activation of the n$^+$-type cathode regions 82 and the p$^+$-type collector regions 22 may be performed by heating by laser. Activation of the n$^+$-type FS layer 20 may be performed by heating by laser under treatment conditions different from treatment conditions for activation of the n$^+$-type cathode regions 82 and the p$^+$-type collector regions 22, or may be performed by annealing by a furnace at a relatively low temperature of at most about 400 degrees C. Next, an entire area of the substrate front surface, for example, is covered by a surface protecting film such as a polyimide film (not depicted) and thereafter, the surface protecting film is patterned, exposing the front electrode 130 and electrode pads.

Next, helium irradiation is performed from the substrate back surface, lattice defects that become lifetime killers are induced in the n$^-$-type semiconductor substrate 18 to span the diode regions 80 and portions of the IGBT regions 70 near borders between the IGBT regions 70 and the diode regions 80, thereby forming the lifetime killer control regions 72.

Next, the lattice defects due to the helium irradiation are recovered by a heat treatment (annealing), thereby adjusting the lattice defect amount in the semiconductor substrate, whereby the carrier lifetime is adjusted.

Next, in an entire area of the back surface of the semiconductor substrate, the back electrode 24 in contact with the $n^+$-type cathode regions 82 and the $p^+$-type collector regions 22 is formed. Thereafter, the semiconductor wafer is cut (diced) into individual chips, whereby the RC-IGBT 150 depicted in FIG. 2 is completed.

As described above, according to the first embodiment, the $n^+$-type FS layer is provided at a position deeper from the back surface of the $n^-$-type semiconductor substrate in the IGBT regions than in diode regions. As a result, in the diode regions, a thickness of the $n^-$-type semiconductor substrate that is the drift layer is thick, the depletion layer does not easily reach the back surface of the $n^-$-type semiconductor substrate, and the breakdown voltage of the diode region may be increased. Therefore, a sufficient breakdown voltage may be ensured and even when a large reverse recovery surge voltage is applied, device elements are not easily destroyed and the semiconductor device becomes highly reliable.

A structure of a semiconductor device according to a second embodiment is similar to the structure of the semiconductor device according to the first embodiment and therefore, description thereof is omitted hereinafter.

Next, a method of manufacturing the semiconductor device according to the second embodiment is described. FIGS. 9, 10, 11, and 12 are cross-sectional views depicting states of the active region 90 of the semiconductor device according to the second embodiment during manufacture. Here, in FIGS. 9 to 12, the front device element structures are not depicted and similarly in FIGS. 13 to 22 hereinafter.

First, similarly to the first embodiment, the front device element structures are formed on the front side of the $n^-$-type semiconductor substrate 18 that becomes the n-type drift layer (the first process to the fourth process).

Figure 9:
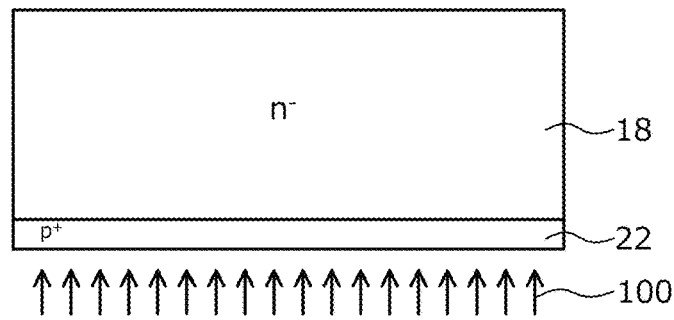
FIG. 9 is a cross-sectional view depicting a state of an active region of a semiconductor device according to a second embodiment during manufacture.

Next, the $n^-$-type semiconductor substrate 18 is ground from the back side thereof, to a position corresponding to a product thickness used for the semiconductor device. Next, in an entire area of the back surface of the $n^-$-type semiconductor substrate 18, for example, the ion implantation 100 of a p-type impurity such as boron (B) is performed, thereby forming the $p^+$-type collector regions 22 in a surface layer of the $n^-$-type semiconductor substrate 18, in an entire area of the back surface of the $n^-$-type semiconductor substrate 18 (the fifth process). When there are portions in which the p-type impurity is not implanted such as due to particles, breakdown voltage failures, etc. occur and therefore, the p-type impurity is immediately ion-implanted from a state in which the implantation surface is clean so that the process does not proceed in a state in which the back surface of the $n^-$-type semiconductor substrate 18 is exposed. The state up to here is depicted in FIG. 9.

Figure 10:
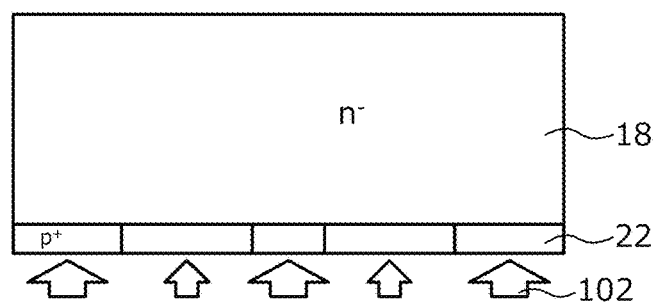
FIG. 10 is a cross-sectional view depicting a state of the active region of the semiconductor device according to the second embodiment during manufacture.

Next, the laser annealing 102 is performed from the back surface of the $n^-$-type semiconductor substrate 18 (the sixth process). Laser of an energy higher than the band end is irradiated, and the ion-implanted p-type impurity is activated by heating. Here, by changing the scanning speed of the laser, regions for which the intensity of the laser annealing 102 is strong and regions for which the intensity is weak are created separately. The intensity of the laser annealing is described hereinafter with reference to FIGS. 24 and 25. In FIG. 10, narrow arrows indicate regions for which the intensity of the laser annealing 102 is weak and wide arrows indicate regions for which the intensity of the laser annealing 102 is strong. While crystal defects are formed in the $p^+$-type collector regions 22 by the ion implantation 100 of a p-type impurity, a majority of the crystal defects are recovered by the heat when the laser annealing 102 is strong, thereby enabling formation of regions in which the density of crystal defects is low. On the other hand, when the laser annealing 102 is weak, a majority of the crystal defects are not sufficiently recovered by the heat, thereby enabling regions in which the density of crystal defects is high. In this manner, differences in the amount of crystal defects in the $n^-$-type semiconductor substrate 18 at the back surface thereof are created by the strength of the intensity of the laser annealing 102.

For example, during the laser annealing 102, laser light is scanned and the crystal defects may be eliminated by a vertical axis overlap percentage (percentage of area of overlapping portions) of at least 50%, a pulse width in range from 100 ns to 300 ns in a halfwidth, an energy density j in a range from 1.6 J/cm$^2$ to 2.0 J/cm$^2$, and a frequency in a range from 1 kHz to 3 kHz. Therefore, by the described conditions, by reducing the energy density j of the laser, portions in which the crystal defects are left may be formed.

Here, in the second embodiment, the intensity of the laser annealing for the regions where the $n^+$-type cathode regions 82 are formed is weaker than the intensity of the laser annealing for the regions where the $p^+$-type collector regions 22 are formed. As a result, in the regions where the $p^+$-type collector regions 22 are formed, regions in which the density of crystal defects is low are formed, and in the regions where the $n^+$-type cathode regions 82 are formed, regions in which the density of crystal defects is high are formed. The state up to here is depicted in FIG. 10.

Figure 11:
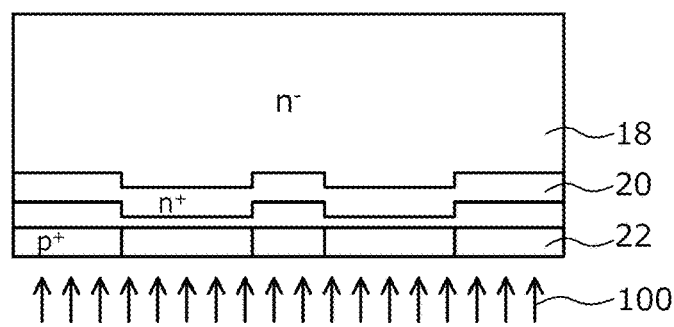
FIG. 11 is a cross-sectional view depicting a state of the active region of the semiconductor device according to the second embodiment during manufacture.

Next, in an entire area of the back surface of the $n^-$-type semiconductor substrate 18, the ion implantation 100 of an n-type impurity such as, for example, phosphorus is performed, thereby forming the $n^+$-type FS layer 20 in the $n^-$-type semiconductor substrate 18 (seventh process). The $n^-$-type semiconductor substrate 18 has different amounts of crystal defects at the back surface thereof, and in regions where the density of crystal defects is high, an n-type impurity does not easily pass through the $n^+$-type cathode regions 82. Therefore, the $n^+$-type FS layer 20 is formed at a position deeper from the back surface of the $n^-$-type semiconductor substrate 18 in the IGBT regions 70 than in the diode regions 80, and the $n^+$-type FS layer 20 may be formed to have an undulating shape. Therefore, in the second embodiment, by a single session of ion implantation, the $n^+$-type FS layer 20 may be formed at a deep position in the IGBT regions 70 and the $n^+$-type FS layer 20 may be formed at a shallow position in the diode regions 80. The state up to here is depicted in FIG. 11.

Figure 12:
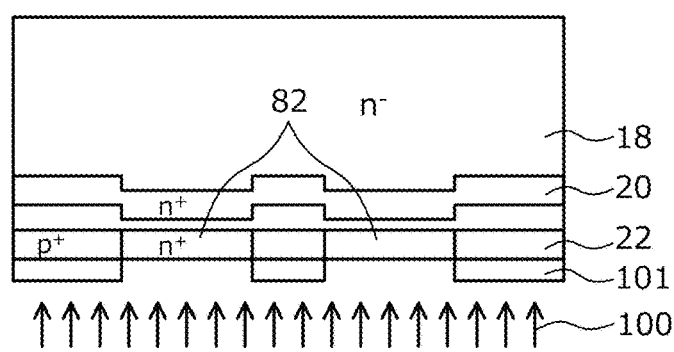
FIG. 12 is a cross-sectional view depicting a state of the active region of the semiconductor device according to the second embodiment during manufacture.

Next, by photolithography, the resist mask 101 opened at portions corresponding to the diode regions 80 and the edge termination region 91 is formed on the back surface of the $n^-$-type semiconductor substrate 18. Next, the ion implantation 100 of an n-type impurity such as, for example, phosphorus (P) is performed using the resist mask 101 as a mask; in a surface layer of the $n^-$-type semiconductor substrate 18 at the back surface thereof, the $p^+$-type collector regions 22 in the edge termination region 91 and the diode regions 80 are inverted to an n-type, thereby forming the $n^+$-type cathode regions 82 (eighth process). In this manner, the relaxed field of cathode (RFC) structure in which the n+-type regions and the p+-type regions are arranged adjacently is formed. The state up to here is depicted in FIG. 12.

Next, by an ashing process, the resist mask 101 is removed. Further, an ion species for forming the n+-type FS layer 20 may be phosphorous, hydrogen, arsenic (As), etc. Of these, phosphorus may be preferable. A reason for this is that by performing the ion implantation for forming the n+-type FS layer 20 using phosphorus, the effect of forming the undulating shape due to differences in the amount of crystal defects becomes prominent and formation of the undulating n−-type FS layer 20 is facilitated. Hydrogen is a lighter element than phosphorus and therefore, may be implanted deeper and as compared to an instance in which phosphorus is used, formation of the undulating n+-type FS layer 20 occurs more easily at a deeper position. Arsenic is an element heavier than phosphorus and therefore, as compared to an instance in which phosphorus is used, the undulating n+-type FS layer 20 is formed at a shallower position by ion implantation requiring greater energy. In addition, while selenium, sulfur, etc. may be used as an ion species, these diffuse easily and therefore, forming the n+-type FS layer 20 to have an undulating shape is difficult.

Next, the n+-type cathode regions 82 and the n+-type FS layer 20 are activated by a heat treatment (annealing). A temperature suitable for activation of the n+-type FS layer 20 and a temperature suitable for activation of a layer formed by another impurity differ and therefore, the activation of the n+-type FS layer 20 is performed separately from the activation of the n+-type cathode regions 82. For example, the activation of the n+-type cathode regions 82 may be performed by heating by laser. The activation of the n+-type FS layer 20 may be performed by heating by laser under treatment conditions different from the treatment conditions for the n+-type cathode regions 82, or may be performed by annealing by a furnace at a relatively low temperature of at most about 400 degrees C. Next, an entire area of the substrate front surface, for example, is covered by the surface protecting film such as a polyimide film (not depicted) and thereafter, the surface protecting film is patterned, exposing the front electrode 130 and electrode pads.

Next, helium irradiation is performed from the substrate back surface, lattice defects that become lifetime killers are induced in the n−-type semiconductor substrate 18 to span the diode regions 80 and portions of the IGBT regions 70 near borders between the IGBT regions 70 and the diode regions 80, thereby forming the lifetime killer control regions 72.

Next, the lattice defects due to the helium irradiation are recovered by a heat treatment (annealing), thereby adjusting the lattice defect amount in the semiconductor substrate, whereby the carrier lifetime is adjusted.

Next, the back electrode 24 in contact with the n+-type cathode regions 82 and the p+-type collector regions 22 is formed in an entire area of the back surface of the semiconductor substrate (ninth process). Thereafter, the semiconductor wafer is cut (diced) into individual chips, whereby the RC-IGBT 150 depicted in FIG. 2 is completed.

As described above, according to the second embodiment, similarly to the first embodiment, the n+-type FS layer is provided at a position deeper from the back surface of the n−-type semiconductor substrate in the IGBT regions than in the diode regions. As a result, effects similar to those of the first embodiment are obtained.

A structure of a semiconductor device according to a third embodiment is similar to the structure of the semiconductor device according to the first embodiment and therefore, description thereof is omitted hereinafter.

Figure 13:
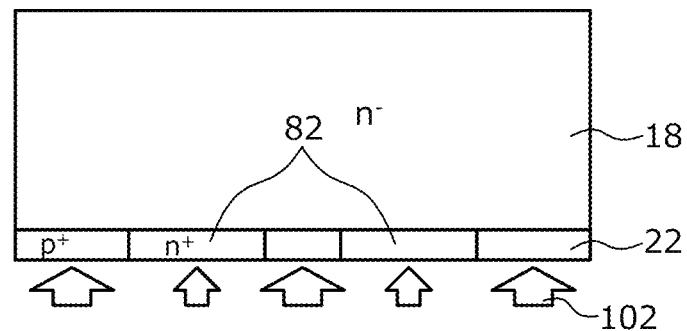
FIG. 13 is a cross-sectional view depicting a state of an active region of a semiconductor device according to a third embodiment during manufacture.
Figure 14:
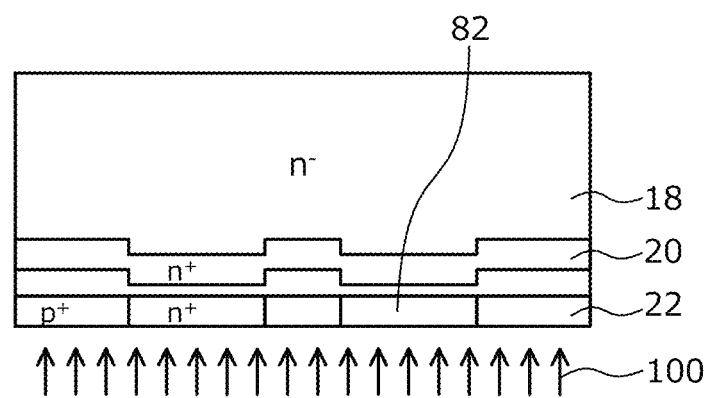
FIG. 14 is a cross-sectional view depicting a state of the active region of the semiconductor device according to the third embodiment during manufacture.

Next, a method of manufacturing the semiconductor device according to the third embodiment is described. FIGS. 13 and 14 are cross-sectional views depicting states of the active region 90 of the semiconductor device according to the third embodiment during manufacture.

First, similarly to the first embodiment, the front device element structures are formed on the front side of the n−-type semiconductor substrate 18 that becomes the n-type drift layer (the first process to the fourth process).

Next, the n−-type semiconductor substrate 18 is ground from the back side thereof, to a position corresponding to a product thickness used for the semiconductor device. Next, in an entire area of the back surface of the n−-type semiconductor substrate 18, for example, the ion implantation 100 of a p-type impurity such as boron (B) is performed, thereby forming the p+-type collector regions 22 in a surface layer of the n−-type semiconductor substrate 18, in an entire area of the back surface of the n−-type semiconductor substrate 18 (the fifth process). When there are portions in which the p-type impurity is not implanted such as due to particles, breakdown voltage failures, etc. occur and therefore, the p-type impurity is immediately ion-implanted from a state in which the implantation surface is clean so that the process does not proceed in a state in which the back surface of the n−-type semiconductor substrate 18 is exposed. The state up to here is similar to that of the second embodiment depicted in FIG. 9.

Next, a resist mask (not depicted) opened at portions corresponding to the diode regions 80 and the edge termination region 91 is formed on the back surface of the n−-type semiconductor substrate 18 by photolithography. Next, the ion implantation 100 of an n-type impurity such as, for example, phosphorus (P) is performed using the resist mask as a mask, whereby in the diode regions 80 and the edge termination region 91, the p+-type collector regions 22 in the surface layer of the n−-type semiconductor substrate 18 at the back surface of the n−-type semiconductor substrate 18 are inverted into an n-type, thereby forming the n+-type cathode regions 82 (the sixth process). In this manner, the RFC structure in which n+-type regions and p+-type regions are arranged adjacently is formed.

Next, the resist mask 101 is removed by an ashing process. Next, the laser annealing 102 is performed from the back surface of the n−-type semiconductor substrate 18. As a result, the n+-type cathode regions 82 and the p+-type collector regions 22 are activated (the seventh process). Laser of an energy higher than the band end is irradiated, and the ion-implanted p-type impurity and the ion-implanted n-type impurity are activated by heating. Here, by changing the scanning speed of the laser, regions for which the intensity of the laser annealing 102 is strong and regions for which the intensity is weak are created separately. In FIG. 13, narrow arrows indicate regions for which the intensity of the laser annealing 102 is weak and wide arrows indicate regions for which the intensity of the laser annealing 102 is strong. While crystal defects are formed in the p+-type collector regions 22 by the ion implantation 100 of a p-type impurity, a majority of the crystal defects are recovered by the heat when the laser annealing 102 is strong, thereby enabling formation of regions in which the density of crystal defects is low. In this manner, differences in the amount of crystal defects in the n−-type semiconductor substrate 18 at the back surface thereof are created by the strength of the intensity of the laser annealing 102.

Here, in the second embodiment, the intensity of the laser annealing for the regions where the n+-type cathode regions 82 are formed is weaker than the intensity of the laser annealing for the regions where the p$^+$-type collector regions 22 are formed. As a result, in the regions where the p$^+$-type collector regions 22 are formed, regions in which the density of crystal defects is low are formed, and in the regions where the n$^+$-type cathode regions 82 are formed, regions in which the density of crystal defects is high are formed. The state up to here is depicted in FIG. 10.

Next, in an entire area of the back surface of the n$^-$-type semiconductor substrate 18, the ion implantation 100 of an n-type impurity such as, for example, phosphorus is performed, thereby forming the n$^+$-type FS layer 20 in the n$^-$-type semiconductor substrate 18 (the eighth process). The n$^-$-type semiconductor substrate 18 has different amounts of crystal defects at the back surface thereof, and in regions in which the density of crystal defects is high, an n-type impurity does not easily pass through the n$^+$-type cathode regions 82. Therefore, the n$^-$-type FS layer 20 is formed at a position deeper from the back surface of the n$^-$-type semiconductor substrate 18 in the IGBT regions 70 than in the diode regions 80, and the n$^+$-type FS layer 20 may be formed to have an undulating shape. Therefore, in the third embodiment, by a single session of ion implantation, the n$^-$-type FS layer 20 may be formed at a deep position in the IGBT regions 70 and the n$^+$-type FS layer 20 may be formed at a shallow position in the diode regions 80. The state up to here is depicted in FIG. 14.

In the third embodiment, ion implantation for forming the n$^+$-type cathode regions 82 and the p$^+$-type collector regions 22 is performed before the laser annealing 102. Therefore, as compared to the second embodiment in which only the ion implantation for forming the p$^+$-type collector regions 22 is performed, the crystal defect difference is greater and the difference of the depths of the n$^+$-type FS layer 20 in the IGBT regions 70 and in the diode regions 80 may be increased. Further, by changing the strength of the intensity of the laser annealing 102 for portions of the n$^+$-type cathode regions 82, the depth of the n$^+$-type FS layer 20 in the diode regions 80 may be adjusted.

Next, by a heat treatment (annealing), the n$^+$-type FS layer 20 is activated. The activation of the n$^+$-type FS layer 20 may be performed by heating by laser under treatment conditions different from the treatment conditions for the n$^+$-type cathode regions 82, or may be performed by annealing by a furnace at a relatively low temperature of at most about 400 degrees C. Next, an entire area of the substrate front surface, for example, is covered by the surface protecting film such as a polyimide film (not depicted) and thereafter, the surface protecting film is patterned, exposing the front electrode 130 and electrode pads.

Next, helium irradiation is performed from the substrate back surface, lattice defects that become lifetime killers are induced in the n$^-$-type semiconductor substrate 18 to span the diode regions 80 and portions of the IGBT regions 70 near borders between the IGBT regions 70 and the diode regions 80, thereby forming the lifetime killer control regions 72.

Next, the lattice defects due to the helium irradiation are recovered by a heat treatment (annealing), thereby adjusting the lattice defect amount in the semiconductor substrate, whereby the carrier lifetime is adjusted.

Next, in an entire area of the back surface of the semiconductor substrate, the back electrode 24 in contact with the n$^+$-type cathode regions 82 and the p$^+$-type collector regions 22 is formed (the ninth process). Thereafter, the semiconductor wafer is cut (diced) into individual chips, whereby the RC-IGBT 150 depicted in FIG. 2 is completed.

As described above, according to the third embodiment, similarly to the first embodiment, the n$^+$-type FS layer is provided at a position deeper from the back surface of the n$^-$-type semiconductor substrate in the IGBT regions than in the diode regions. As a result, effects similar to those of the first embodiment are obtained. In the third embodiment, ion implantation for forming the n$^+$-type cathode regions and the p$^+$-type collector regions is performed before the laser annealing. Therefore, as compared to the second embodiment in which only the ion implantation for forming the p$^+$-type collector regions is performed, the crystal defect difference is greater and the difference of the depths of the n$^+$-type FS layer in the IGBT regions and in the diode regions may be increased.

In the first to the third embodiments, the RC-IGBT 150 integrates on a single semiconductor substrate (semiconductor chip), an IGBT having a trench gate structure and a diode connected in antiparallel to the IGBT. Nonetheless, the present invention is not limited to the RC-IGBT 150 and is further applicable to an IGBT alone and a diode alone.

A structure of an IGBT of a semiconductor device according to a fourth embodiment is configured by the IGBT regions 70 and the edge termination region 91 in FIG. 2, i.e., is the configuration excluding the diode regions 80 from FIG. 2. On the other hand, a structure of a diode of the semiconductor device according to the fourth embodiment is configured by the diode regions 80 and the edge termination region 91 in FIG. 2, i.e., is the configuration excluding the IGBT regions 70 from FIG. 2.

Figure 15:
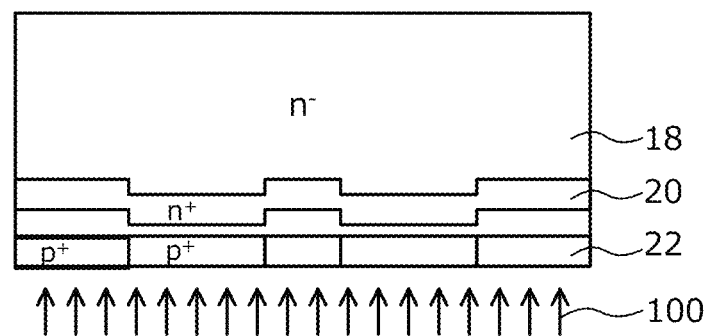
FIG. 15 is a cross-sectional view depicting a state of an active region of a semiconductor device according to a fourth embodiment during manufacture.

Next, a method of manufacturing the semiconductor device according to the fourth embodiment is described. FIG. 15 is a cross-sectional view depicting a state of the active region 90 of the semiconductor device according to the fourth embodiment during manufacture. FIG. 15 depicts a state of the active region 90 during manufacture in an instance in which an IGBT is formed; and in an instance in which a diode is formed, in the active region 90 during manufacture, the portions of the p$^+$-type collector regions 22 are the n$^+$-type cathode regions 82.

First, similarly to the first embodiment, the front device element structures are formed on the front side of the n$^-$-type semiconductor substrate 18 that becomes the n-type drift layer (the first process to the fourth process in an instance of the IGBT, the first process to the third process in an instance of the diode, hereinafter similarly indicated in the order of an instance of the IGBT and an instance of the diode).

Next, the n$^-$-type semiconductor substrate 18 is ground from the back side thereof, to a position corresponding to a product thickness used for the semiconductor device. Next, in an entire area of the back surface of the n$^-$-type semiconductor substrate 18, the ion implantation 100 of a p-type impurity such as, for example, boron (B) or phosphorus (P), etc., or an n-type impurity is performed, thereby forming the p$^+$-type collector regions 22 or the n$^+$-type cathode regions 82 in a surface layer of the n$^-$-type semiconductor substrate 18, in an entire area of the back surface of the n$^-$-type semiconductor substrate 18 (the fifth process, the fourth process). When there are portions in which the p-type impurity is not implanted such as due to particles, breakdown voltage failures, etc. occur and therefore, the p-type impurity or the n-type impurity is immediately ion-implanted from a state in which the implantation surface is clean so that the process does not proceed in a state in which the back surface of the n$^-$-type semiconductor substrate 18 is exposed. The state up to here in an instance of formation of the IGBT is similar to that of the second embodiment depicted in FIG. 9. The state up to here in an instance of formation of the diode is similar to that of the second embodiment depicted in FIG. 9 in which the portions of the p$^+$-type collector regions 22 are the n$^+$-type cathode regions 82.

Next, the laser annealing 102 is performed from the back surface of the n$^-$-type semiconductor substrate 18 (the sixth process, the fifth process). Laser of an energy higher than the band end is irradiated, and the ion-implanted p-type impurity or the ion-implanted n-type impurity is activated by heating. Here, by changing the scanning speed of the laser, etc., the intensity of the laser annealing for predetermined regions of the p$^+$-type collector regions 22 or the n$^+$-type cathode regions 82 is made weaker than the intensity of the laser annealing for regions other than the predetermined regions of the p$^+$-type collector regions 22 or the n$^-$-type cathode regions 82, and regions for which the intensity of the laser annealing 102 is strong and regions for which the intensity is weak are created separately. Here, in the fourth embodiment, regions in which the density of the crystal defects is low are formed as the predetermined regions assumed to be regions in which the n$^+$-type FS layer 20 is formed deeply, and regions in which the density of the crystal defects is high are formed as regions other than the predetermined regions assumed to be regions in which the n$^+$-type FS layer 20 is formed shallowly.

Next, in an entire area of the back surface of the n$^-$-type semiconductor substrate 18, the ion implantation 100 of an n-type impurity such as, for example, phosphorus is performed, thereby forming the n$^+$-type FS layer 20 in the n$^-$-type semiconductor substrate 18 (the sixth process, the fifth process). The n$^-$-type semiconductor substrate 18 has different amounts of crystal defects at the back surface thereof, and in regions in which the density of crystal defects is high, an n-type impurity does not easily pass through the n$^+$-type cathode regions 82. Therefore, the n$^+$-type FS layer 20 is formed having an undulating shape. Therefore, in the fourth embodiment, by a single session of ion implantation, the n$^+$-type FS layer 20 having an undulating shape may be formed in the IGBT and in the diode. The state up to here is depicted in FIG. 15.

Thereafter, the heat treatment (annealing) and subsequent processes of the first embodiment are performed, whereby the IGBT or the diode is completed.

As described above, according to the fourth embodiment, the n$^+$-type FS layer having an undulating shape may be formed for the IGBT alone and for the diode alone. For example, in the IGBT or the diode, the depth of the n$^+$-type FS layer is changed in the active region and the edge termination region, and the breakdown voltage in the active region and the breakdown voltage in the edge termination region may differ.

A structure of a semiconductor device according to a fifth embodiment is similar to the structure of the semiconductor device according to the fourth embodiment, i.e., is a structure of an IGBT alone or a diode alone.

Figure 16:
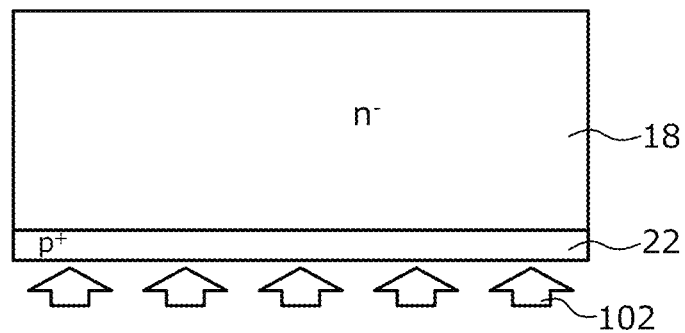
FIG. 16 is a cross-sectional view depicting a state of an active region of a semiconductor device according to a fifth embodiment during manufacture.
Figure 17:
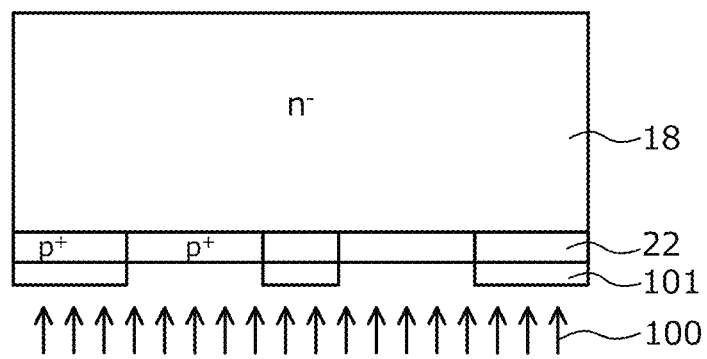
FIG. 17 is a cross-sectional view depicting a state of the active region of the semiconductor device according to the fifth embodiment during manufacture.
Figure 18:
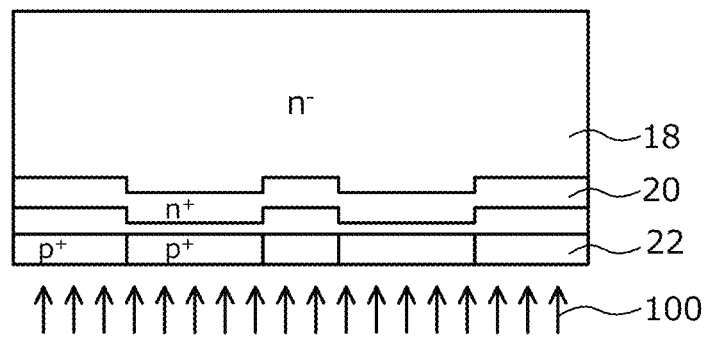
FIG. 18 is a cross-sectional view depicting a state of the active region of the semiconductor device according to the fifth embodiment during manufacture.

Next, a method of manufacturing the semiconductor device according to the fifth embodiment is described. FIGS. 16, 17, and 18 are cross-sectional views depicting states of the active region 90 of the semiconductor device according to the fifth embodiment during manufacture. FIGS. 16 to 18 depict states of the active region 90 during manufacture in an instance in which an IGBT is formed; and in an instance in which a diode is formed, in the active region 90 during manufacture, the portions of the p$^+$-type collector regions 22 are the n$^+$-type cathode regions 82.

First, similarly to the first embodiment, the front device element structures are formed on the front side of the n$^-$-type semiconductor substrate 18 that becomes the n-type drift layer (the first process to the fourth process, the first process to the third process).

Next, the n$^-$-type semiconductor substrate 18 is ground from the back side thereof, to a position corresponding to a product thickness used for the semiconductor device. Next, in an entire area of the back surface of the n$^-$-type semiconductor substrate 18, the ion implantation 100 of a p-type impurity such as, for example, boron (B) or phosphorus (P), etc., or an n-type impurity is performed, thereby forming the p$^+$-type collector regions 22 or the n$^+$-type cathode regions 82 in a surface layer of the n$^-$-type semiconductor substrate 18, in an entire area of the back surface of the n$^-$-type semiconductor substrate 18 (the fifth process, the fourth process). When there are portions in which the p-type impurity is not implanted such as due to particles, breakdown voltage failures, etc. occur and therefore, the p-type impurity or the n-type impurity is immediately ion-implanted from a state in which the implantation surface is clean so that the process does not proceed in a state in which the back surface of the n$^-$-type semiconductor substrate 18 is exposed. The state up to here in an instance of formation of the IGBT is similar to that of the second embodiment depicted in FIG. 9. The state up to here in an instance of formation of the diode is similar to that of the second embodiment depicted in FIG. 9 in which the portions of the p$^+$-type collector regions 22 are the n$^+$-type cathode regions 82.

Next, the laser annealing 102 is performed from the back surface of the n$^-$-type semiconductor substrate 18. Laser of an energy higher than the band end is irradiated, and the ion-implanted p-type impurity or the ion-implanted n-type impurity is activated by heating (the sixth process, the fifth process). Here, the intensity of the laser annealing 102 is uniform. The state up to here is depicted in FIG. 16.

Next, the resist mask 101 opened at portions corresponding to regions in which the n$^+$-type FS layer 20 is to be formed shallowly is formed on the back surface of the n$^-$-type semiconductor substrate 18 by photolithography. Next, the ion implantation 100 of argon (Ar) or Si is performed using the resist mask 101 as a mask. Regions in which argon (Ar) or Si is implanted are regions in which the crystal defects collapse and the density of the crystal defects is low (the seventh process, the sixth process). The state up to here is depicted in FIG. 17.

Next, the resist mask 101 is removed by an ashing process. Next, in an entire area of the back surface of the n$^-$-type semiconductor substrate 18, the ion implantation 100 of an n-type impurity such as, for example, phosphorus is performed, thereby forming the n$^+$-type FS layer 20 in the n$^-$-type semiconductor substrate 18 (the eighth process, the seventh process). The n$^-$-type semiconductor substrate 18 has different amounts of crystal defects at the back surface thereof, and in regions in which the density of crystal defects is high, an n-type impurity does not easily pass through the n$^+$-type cathode regions 82. Therefore, the n$^+$-type FS layer 20 is formed having an undulating shape. Therefore, in the fifth embodiment, by a single session of ion implantation, the n$^+$-type FS layer 20 having an undulating shape may be formed in the IGBT and the diode. The state up to here is depicted in FIG. 18.

Thereafter, the heat treatment (annealing) and subsequent processes of the first embodiment are performed, whereby the IGBT or the diode is completed.

As described above, according to the fifth embodiment, similarly to the fourth embodiment, the n$^+$-type FS layer having an undulating shape may be formed for the IGBT alone and for the diode alone. As a result, effects similar to those of the fourth embodiment are obtained.

A structure of a semiconductor device according to a sixth embodiment is similar to the structure of the semiconductor device according to the fourth embodiment, i.e., is a structure of an IGBT alone or a diode alone.

Next, a method of manufacturing the semiconductor device according to the sixth embodiment is described. FIGS. 19, 20, 21, and 22 are cross-sectional views depicting states of the active region 90 of the semiconductor device according to the sixth embodiment during manufacture. FIGS. 19 to 22 depict states of the active region 90 during manufacture in an instance in which an IGBT is formed; and in an instance in which a diode is formed, in the active region 90 during manufacture, the portions of the p$^+$-type collector regions 22 are the n$^+$-type cathode regions 82.

First, similarly to the first embodiment, the front device element structures are formed on the front side of the n$^-$-type semiconductor substrate 18 that becomes the n-type drift layer (the first process to the fourth process, the first process to the third process).

Figure 19:
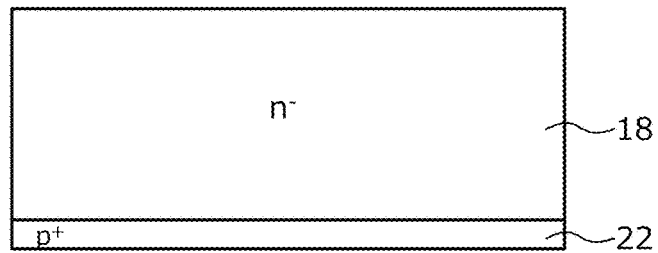
FIG. 19 is a cross-sectional view depicting a state of an active region of a semiconductor device according to a sixth embodiment during manufacture.

Next, the n$^-$-type semiconductor substrate 18 is ground from the back side thereof, to a position corresponding to a product thickness used for the semiconductor device. Next, in an entire area of the back surface of the n$^-$-type semiconductor substrate 18, the ion implantation 100 of a p-type impurity such as, for example, boron (B) or phosphorus (P), etc., or an n-type impurity is performed, thereby forming the p$^+$-type collector regions 22 or the n$^+$-type cathode regions 82 in a surface layer of the n$^-$-type semiconductor substrate 18, in an entire area of the back surface of the n$^-$-type semiconductor substrate 18 (the fifth process, the fourth process). When there are portions in which the p-type impurity is not implanted such as due to particles, breakdown voltage failures, etc. occur and therefore, the p-type impurity or the n-type impurity is immediately ion-implanted from a state in which the implantation surface is clean so that the process does not proceed in a state in which the back surface of the n$^-$-type semiconductor substrate 18 is exposed. The state up to here is depicted in FIG. 19.

Figure 20:
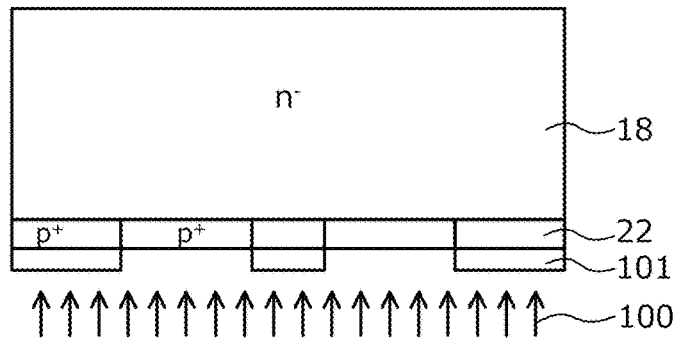
FIG. 20 is a cross-sectional view depicting a state of the active region of the semiconductor device according to the sixth embodiment during manufacture.

Next, the resist mask 101 opened at portions corresponding to regions in which the n$^+$-type FS layer 20 is to be formed shallowly is formed on the back surface of the n$^-$-type semiconductor substrate 18 by photolithography. Next, the ion implantation 100 of Ar or Si is performed using the resist mask 101 as a mask. Regions in which argon (Ar) or Si is implanted are regions in which the crystal defects collapse and the density of the crystal defects is low (the seventh process, the sixth process). The state up to here is depicted in FIG. 20.

Figure 21:
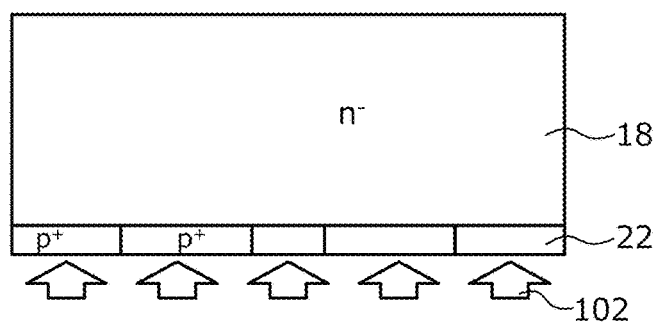
FIG. 21 is a cross-sectional view depicting a state of the active region of the semiconductor device according to the sixth embodiment during manufacture.

Next, the resist mask 101 is removed by an ashing process. Next, the laser annealing 102 is performed from the back surface of the n$^-$-type semiconductor substrate 18. Laser of an energy higher than the band end is irradiated, and the ion-implanted p-type impurity or the ion-implanted n-type impurity is activated by heating (the sixth process, the fifth process). Here, the intensity of the laser annealing 102 is uniform. The state up to here is depicted in FIG. 21.

Figure 22:
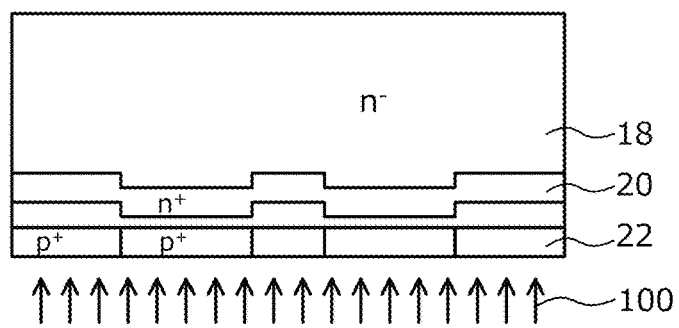
FIG. 22 is a cross-sectional view depicting a state of the active region of the semiconductor device according to the sixth embodiment during manufacture.

Next, in an entire area of the back surface of the n$^-$-type semiconductor substrate 18, the ion implantation 100 of an n-type impurity such as, for example, phosphorus is performed, thereby forming the n$^+$-type FS layer 20 in the n$^-$-type semiconductor substrate 18 (the eighth process, the seventh process). Due to effects of the ion implantation 100, the n$^-$-type semiconductor substrate 18 has different amounts of crystal defects at the back surface thereof even after the laser annealing 102. In regions in which the density of crystal defects is high, an n-type impurity does not easily pass through the n$^+$-type cathode regions 82. Therefore, the n$^+$-type FS layer 20 is formed having an undulating shape. Therefore, in the sixth embodiment, by a single session of ion implantation, the n$^+$-type FS layer 20 having an undulating shape may be formed in the IGBT and in the diode. The state up to here is depicted in FIG. 22. In the sixth embodiment, the laser annealing 102 is performed after the p-type impurity or the n-type impurity is ion-implanted and therefore, as compared to the fifth embodiment, the amount of crystal defects may be smaller and the difference of the depths of the n$^+$-type FS layer 20 may be smaller than in the fifth embodiment.

Thereafter, the heat treatment (annealing) and subsequent processes of the first embodiment are performed, whereby the IGBT or the diode is completed.

As described above, according to the sixth embodiment, similarly to the fourth embodiment, the n$^+$-type FS layer having an undulating shape may be formed for the IGBT alone and for the diode alone. As a result, effects similar to those of the fourth embodiment are obtained.

Figure 23:
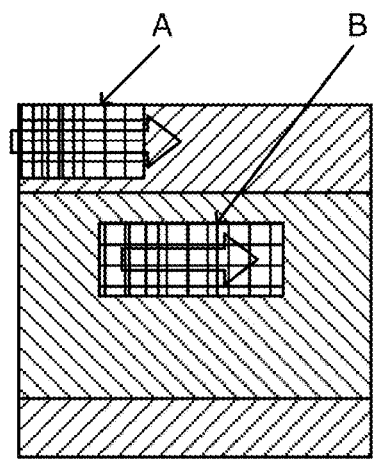
FIG. 23 is a diagram depicting a method of separately creating regions for which an intensity of a laser annealing is strong and regions for which the intensity is weak.
Figure 24:
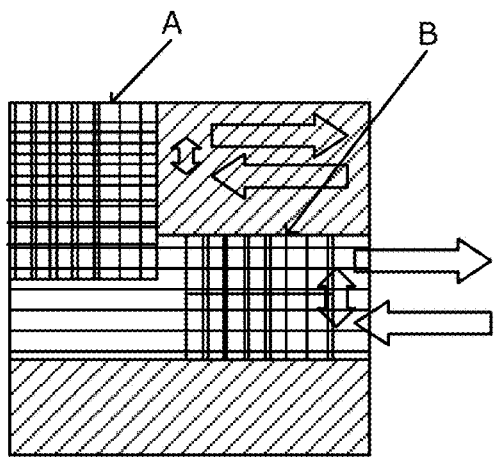
FIG. 24 is a diagram depicting a method of separately creating regions for which the intensity of the laser annealing is strong and regions for which the intensity is weak.
Figure 25:
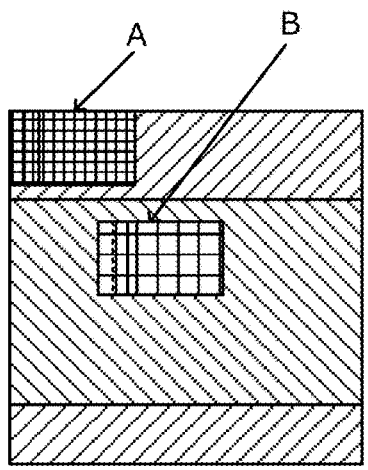
FIG. 25 is a diagram depicting a method of separately creating regions for which the intensity of the laser annealing is strong and regions for which the intensity is weak.
Figure 26:
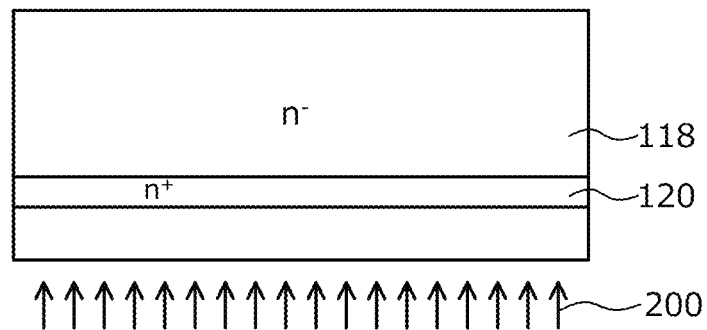
FIG. 26 is a cross-sectional view depicting a state of a conventional RC-IGBT having an n-type FS layer during manufacture.
Figure 27:
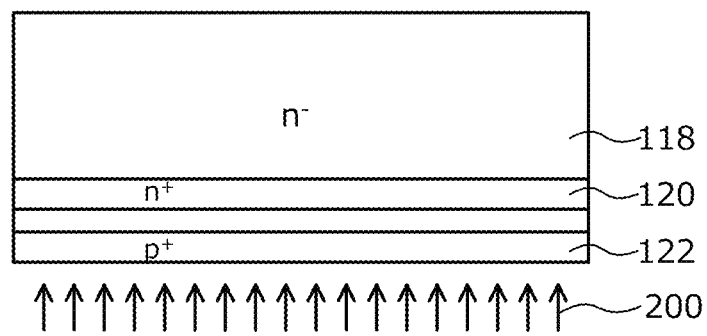
FIG. 27 is a cross-sectional view depicting a state of the conventional RC-IGBT having an n-type FS layer during manufacture.
Figure 28:
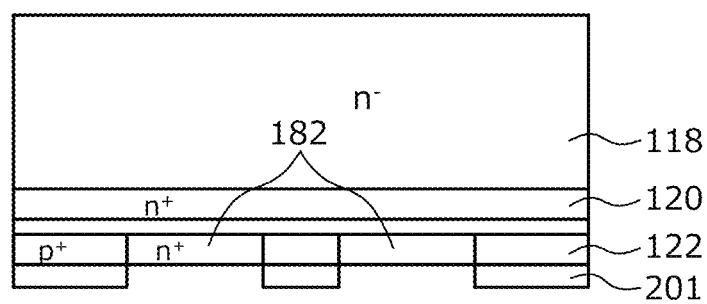
FIG. 28 is a cross-sectional view depicting a state of the conventional RC-IGBT having an n-type FS layer during manufacture.

Next, a method of separately creating regions for which the intensity of the laser annealing is strong and regions for which the intensity is weak is described. FIGS. 23, 24, and 25 are diagrams depicting a method of separately creating regions for which the intensity of the laser annealing is strong and regions for which the intensity is weak. In FIG. 23, during the laser annealing, the scanning speed of the laser is changed. For example, by reducing the scanning speed of the laser like reference character A in FIG. 23, the amount of time that laser is irradiated per unit area is increased and a region for which the intensity of the laser annealing is strong may be formed. Further, by increasing the scanning speed of the laser like reference character B in FIG. 23, the amount of time that laser is irradiated per unit area is reduced and a region for which the intensity of the laser annealing is weak may be formed. Further, by maintaining the same scanning speed of the laser and reducing the laser pulse by an electrical filter or the like, the amount of laser irradiated per unit area is reduced and a region for which the intensity of the laser annealing is weak may be formed.

In FIG. 24, during the laser annealing, the amount of overlap of the laser pulse is changed. For example, when the scanning line is moved like reference character A in FIG. 24, the movement length is shortened and the overlap of adjacent scanning lines is increased, whereby the number of laser irradiations irradiated per unit area is increased and a region for which the intensity of the laser annealing is strong is formed. Further, when the scanning line is moved like reference character B in FIG. 24, the movement length is increased and the overlap of adjacent scanning lines is reduced, whereby the number of laser irradiations irradiated per unit area is reduced and a region for which the intensity of the laser annealing is weak is formed. For example, when laser is irradiated to the same place four times, a region for which the intensity of the laser annealing is strong is formed and when laser is irradiated to the same place two times, a region for which the intensity of the laser annealing is weak is formed. This method is further applicable to continuous laser instead of pulsed laser.

In FIG. 25, during the laser annealing, the energy of the laser pulse is changed. For example, by increasing the energy of the laser pulse like reference character A in FIG. 25, the energy of the laser irradiated per unit area is increased and a region for which the intensity of the laser annealing is strong is formed. Further, by reducing the energy of the laser pulse like reference character B in FIG. 25, the energy of the laser irradiated per unit area is reduced and a region for which the intensity of the laser annealing is weak is formed. For example, by irradiating the laser via a mask (shutter/filter), laser intensity distribution may be caused to exhibit an arbitrary pattern, whereby the laser intensity of an arbitrary position in the substrate may be increased. This method is further applicable to continuous laser instead of pulsed laser.

Other than these methods, by changing the scanning speed of the laser, regions for which the intensity of the laser annealing is strong and regions for which the intensity is weak may be created separately. In these methods, the spot of the pulsed laser has a rectangular shape and therefore, preferably, the amount of overlap may be changed or the laser pulse may be reduced by a filter.

In the foregoing, while an instance in which a MOS gate structure on a first main surface of a silicon substrate is configured is described as an example, without limitation hereto, various modifications are possible such as changing the type of semiconductor (for example, silicon carbide (SiC), etc.), plane orientation of the substrate main surface, etc. Further, in the first embodiment of the present invention, while a trench-type RC-IGBT is described as an example, without limitation hereto, application to semiconductor devices of various configurations such as a planar-type semiconductor device is possible. Further, in the embodiments, while the first conductivity type is assumed to be an n-type and the second conductivity type is assumed to be a p-type, the present invention is similarly implemented when the first conductivity type is a p-type and the second conductivity type is an n-type.

According to an embodiment, a semiconductor device includes a semiconductor substrate of a first conductivity type, having a first main surface and a second main surface that are opposite to each other; a first semiconductor region of a second conductivity type, provided in the semiconductor substrate, closer to the first main surface than to the second main surface, the first semiconductor region having a first surface and a second surface that are opposite to each other, the second surface of the first semiconductor region being closer to the second main surface than is the first surface of the first semiconductor region; a plurality of second semiconductor regions of the first conductivity type, selectively provided in the first semiconductor region at the first surface of the first semiconductor region; a gate insulating film having a first surface and a second surface that are opposite to each other, the first surface of the gate insulating film being in contact with the first semiconductor region; a gate electrode provided on the second surface of the gate insulating film; a first semiconductor layer of the first conductivity type, provided in the semiconductor substrate; a third semiconductor region of the second conductivity type, provided in the semiconductor substrate at the second main surface of the semiconductor substrate; a first electrode provided on the first surface of the first semiconductor region and surfaces of the second semiconductor regions; and a second electrode provided on a surface of the third semiconductor region. The first semiconductor layer has a predetermined region, a depth of the predetermined region from the second main surface of the semiconductor substrate is greater than a depth of a region of the first semiconductor layer excluding the predetermined region, from the second main surface of the semiconductor substrate.

According to another embodiment, a method of manufacturing a semiconductor device includes preparing a semiconductor substrate having a first main surface and a second main surface that are opposite to each other; forming a first semiconductor region of a second conductivity type, in the semiconductor substrate, closer to the first main surface than to the second main surface, the first semiconductor region having a first surface and a second surface that are opposite to each other, the second surface of the first semiconductor region being closer to the second main surface than is the first surface of the first semiconductor region; selectively forming a plurality of second semiconductor regions of the first conductivity type, in the first semiconductor region at the first surface of the first semiconductor region; forming a gate insulating film having a first surface and a second surface that are opposite to each other, the first surface of the gate insulating film being in contact with the first semiconductor region; and forming a gate electrode on the second surface of the gate insulating film; forming a first electrode on the first surface of the first semiconductor region and surfaces of the second semiconductor regions; implanting an impurity of the second conductivity type from the second main surface of the semiconductor substrate and forming a third semiconductor region of the second conductivity type; performing a laser annealing for activating the third semiconductor region, a first intensity of the laser annealing for a predetermined region of the third semiconductor region being weaker than a second intensity of the laser annealing for a region of the third semiconductor region excluding the predetermined region; implanting an impurity of the first conductivity type from the second main surface of the semiconductor substrate and forming a first semiconductor layer of the first conductivity type; and forming a second electrode on a surface of the third semiconductor region.

According to another embodiment, a method of manufacturing a semiconductor device includes preparing a semiconductor substrate having a first main surface and a second main surface that are opposite to each other; forming a first semiconductor region of a second conductivity type, in the semiconductor substrate, closer to the first main surface than to the second main surface, the first semiconductor region having a first surface and a second surface that are opposite to each other, the second surface of the first semiconductor region being closer to the second main surface than is the first surface of the first semiconductor region; selectively forming a plurality of second semiconductor regions of the first conductivity type, in the first semiconductor region at the first surface of the first semiconductor region; forming a gate insulating film having a first surface and a second surface that are opposite to each other, the first surface of the gate insulating film being in contact with the first semiconductor region; and forming a gate electrode on the second surface of the gate insulating film; forming a first electrode on the first surface of the first semiconductor region and surfaces of the second semiconductor regions; implanting an impurity of the second conductivity type from the second main surface of the semiconductor substrate and forming a third semiconductor region of the second conductivity type; performing a laser annealing for activating the third semiconductor region; ion-implanting argon (Ar) or silicon (Si) in a predetermined region of the third semiconductor region; implanting an impurity of the first conductivity type from the second main surface of the semiconductor substrate and forming a first semiconductor layer of the first conductivity type; and forming a second electrode on a surface of the third semiconductor region. In the method, the laser annealing is performed after the argon (Ar) or silicon (Si) is ion-implanted but before the first semiconductor layer is formed.

According to another embodiment, a semiconductor device includes a semiconductor substrate of a first conductivity type, having a first main surface and a second main surface that are opposite to each other; a first semiconductor region of a second conductivity type, provided in the semiconductor substrate, closer to the first main surface than to the second main surface, the first semiconductor region having a first surface and a second surface that are opposite to each other, the second surface of the first semiconductor region being closer to the second main surface than is the first surface of the first semiconductor region; a first semiconductor layer of the first conductivity type provided in the semiconductor substrate; a fourth semiconductor region of the first conductivity type, provided in the semiconductor substrate at the second main surface of the semiconductor substrate; a first electrode provided on the first surface of the first semiconductor region; and a second electrode provided on a surface of the fourth semiconductor region. The first semiconductor layer has a predetermined region, a depth of the predetermined region from the second main surface of the semiconductor substrate is greater than a depth of a region of the first semiconductor layer excluding the predetermined region, from the second main surface of the semiconductor substrate.

According to another embodiment, a method of manufacturing a semiconductor device includes preparing a semiconductor substrate having a first main surface and a second main surface that are opposite to each other; forming a first semiconductor region of a second conductivity type, in the semiconductor substrate, closer to the first main surface than to the second main surface, the first semiconductor region having a first surface and a second surface that are opposite to each other, the second surface of the first semiconductor region being closer to the second main surface than is the first surface of the first semiconductor region; selectively forming a plurality of second semiconductor regions of the first conductivity type, in the first semiconductor region at the first surface of the first semiconductor region; forming a first electrode on the first surface of the first semiconductor region; implanting an impurity of the first conductivity type from the second main surface of the semiconductor substrate and forming a fourth semiconductor region of the first conductivity type; performing a laser annealing for activating the fourth semiconductor region, a first intensity of the laser annealing for a predetermined region of the fourth semiconductor region being weaker than a second intensity of the laser annealing for a region of the fourth semiconductor region excluding the predetermined region; implanting an impurity of the first conductivity type from the second main surface of the semiconductor substrate and forming a first semiconductor layer of the first conductivity type; and forming a second electrode on a surface of the fourth semiconductor region.

According to another embodiment, a method of manufacturing a semiconductor device includes preparing a semiconductor substrate having a first main surface and a second main surface that are opposite to each other; forming a first semiconductor region of a second conductivity type, in the semiconductor substrate, closer to the first main surface than to the second main surface, the first semiconductor region having a first surface and a second surface that are opposite to each other, the second surface of the first semiconductor region being closer to the second main surface than is the first surface of the first semiconductor region; selectively forming a plurality of second semiconductor regions of the first conductivity type, in the first semiconductor region at the first surface of the first semiconductor region; forming a first electrode on the first surface of the first semiconductor region; implanting an impurity of the first conductivity type from the second main surface of the semiconductor substrate and forming a fourth semiconductor region of the first conductivity type; performing a laser annealing for activating the fourth semiconductor region; ion-implanting argon (Ar) or silicon (Si) in a predetermined region of the fourth semiconductor region; implanting an impurity of the first conductivity type from the second main surface of the semiconductor substrate and forming a first semiconductor layer of the first conductivity type; and forming a second electrode on a surface of the fourth semiconductor region. In the method, the laser annealing is performed after the argon (Ar) or silicon (Si) is ion-implanted but before the first semiconductor layer is formed.

According to the invention described above, the $n^+$-type FS layer (first semiconductor layer of the first conductivity type) is provided at a deeper position in the IGBT regions (transistor portions) than in the diode regions (diode portions). Here, deep is with reference to the back surface of the $n^-$-type semiconductor substrate (semiconductor substrate of the first conductivity type). The back surface of the $n^-$-type semiconductor substrate is the back surfaces of the $p^+$-type collector regions (third semiconductor regions of the second conductivity type) and the $n^-$-type cathode regions (fourth semiconductor regions of the first conductivity type) provided in a back surface layer of the $n^-$-type semiconductor substrate, said back surfaces face the back electrode (second electrode). As a result, in the diode regions, the thickness of the drift layer formed by the $n^-$-type semiconductor substrate (semiconductor substrate of the first conductivity type) is thick, the depletion layer does not easily reach the front surface of the $n^+$-type FS layer, and the breakdown voltage of the diode region may be increased. Therefore, a sufficient breakdown voltage may be ensured and even when a large reverse recovery surge voltage is applied, device elements are not easily destroyed and the semiconductor device becomes highly reliable.

The semiconductor device and the method of manufacturing a semiconductor device achieve an effect in that a semiconductor device includes a diode region and an IGBT region, and the breakdown voltage is higher in the diode region than in the IGBT region.

As described above, the semiconductor device and the method of manufacturing a semiconductor device according to the present invention are useful for high-voltage semiconductor devices used in power converting equipment, power source devices of various types of industrial machines, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device having a transistor portion and a diode portion, comprising:
   in the transistor portion:
   a semiconductor substrate of a first conductivity type, having a first main surface and a second main surface that are opposite to each other;
   a first semiconductor region of a second conductivity type, provided in the semiconductor substrate, closer to the first main surface than to the second main surface, the first semiconductor region having a first surface and a second surface that are opposite to each other, the second surface of the first semiconductor region being closer to the second main surface than is the first surface of the first semiconductor region;

a plurality of second semiconductor regions of the first conductivity type, each selectively provided in the first semiconductor region at the first surface of the first semiconductor region;

a gate insulating film having a first surface and a second surface that are opposite to each other, the first surface of the gate insulating film being in contact with the first semiconductor region;

a gate electrode provided on the second surface of the gate insulating film;

a first semiconductor layer of the first conductivity type, provided in the semiconductor substrate, the first semiconductor layer having a first surface and a second surface that are opposite to each other, the second surface of the first semiconductor layer being closer to the second main surface than is the first surface of the first semiconductor layer;

a third semiconductor region of the second conductivity type, provided in the semiconductor substrate at the second main surface of the semiconductor substrate;

a first electrode provided on the first surface of the first semiconductor region and surfaces of the second semiconductor regions; and a second electrode provided on a surface of the third semiconductor region;

in the diode portion:
the semiconductor substrate;
the first semiconductor region;
the first semiconductor layer;
a fourth semiconductor region of the first conductivity type, provided in the semiconductor substrate at the second main surface of the semiconductor substrate;
the first electrode provided on the first surface of the first semiconductor region; and
the second electrode provided on a surface of the fourth semiconductor region, wherein a first depth of the first semiconductor layer from the second main surface of the semiconductor substrate to the first surface of the first semiconductor layer in the transistor portion is greater than a second depth of the first semiconductor layer from the second main surface of the semiconductor substrate to the first surface of the first semiconductor layer in diode portion.

2. The semiconductor device according to claim 1, wherein
the first semiconductor layer has a same thickness in the transistor portion and in the diode portion, and
in the transistor portion, a portion of the semiconductor substrate is present between the first semiconductor layer and the third semiconductor region.

3. The semiconductor device according to claim 1, further comprising:
an active region in which the transistor portion and the diode portion are provided and through which a current flows; and
a termination structure portion in which a voltage withstanding structure surrounding a periphery of the active region is formed, the termination structure portion being disposed outside the active region, wherein the termination structure portion has:
the semiconductor substrate,
the first semiconductor layer,
the fourth semiconductor region, and
the second electrode, and
the second depth of the first semiconductor layer from the second main surface of the semiconductor substrate to the first surface of the first semiconductor layer in diode portion is a same as a third depth of the first semiconductor layer from the second main surface of the semiconductor substrate to the first surface of the first semiconductor layer in the termination structure portion.

4. The semiconductor device according to claim 1, wherein
the transistor portion and the diode portion are provided in parallel in the active region, in a plan view of the semiconductor device.

5. A method of manufacturing a semiconductor device having a transistor portion and a diode portion, the method comprising:
preparing a semiconductor substrate having a first main surface and a second main surface that are opposite to each other;
forming a first semiconductor region of a second conductivity type, in the semiconductor substrate, closer to the first main surface than to the second main surface, the first semiconductor region having a first surface and a second surface that are opposite to each other, the second surface of the first semiconductor region being closer to the second main surface of the semiconductor substrate than is the first surface of the first semiconductor region;
selectively forming a plurality of second semiconductor regions of the first conductivity type, in the first semiconductor region at the first surface of the first semiconductor region;
in the transistor portion, forming a gate insulating film having a first surface and a second surface that are opposite to each other, the first surface of the gate insulating film being in contact with the first semiconductor region; and forming a gate electrode on the second surface of the gate insulating film;
forming a first electrode on surfaces of the second semiconductor regions and the first surface of the first semiconductor region in the transistor portion and on the first surface of the first semiconductor region in the diode portion;
making a first amount of crystal defects of a first back surface layer of the semiconductor substrate corresponding to the diode portion greater than a second amount of crystal defects of a second back surface layer of the semiconductor substrate corresponding to the transistor portion;
implanting an impurity of the first conductivity type from the second main surface of the semiconductor substrate and forming a first semiconductor layer of the first conductivity type after making the first amount greater than the second amount but before an annealing treatment;
forming a third semiconductor region of the second conductivity type, on the second main surface of the semiconductor substrate corresponding to the transistor portion;

forming a fourth semiconductor region of the first conductivity type, on the second main surface of the semiconductor substrate corresponding to the diode portion; and forming a second electrode on a surface of the third semiconductor region and a surface of the fourth semiconductor region.

6. The method according to claim 5, wherein
phosphorus (P) is used to form the first semiconductor layer.

7. The method according to claim 5, wherein
ion-implantation of any one of argon (Ar), xenon (Xe), and silicon (Si) is performed to make the first amount of crystal defects of the first back surface layer corresponding to the diode portion greater than the second amount of crystal defects of the second back surface layer corresponding to the transistor portion.

8. A method of manufacturing a semiconductor device having a transistor portion and a diode portion, the method comprising:

preparing a semiconductor substrate having a first main surface and a second main surface that are opposite to each other;

forming a first semiconductor region of a second conductivity type, in the semiconductor substrate, closer to the first main surface than to the second main surface, the first semiconductor region having a first surface and a second surface that are opposite to each other, the second surface of the first semiconductor region being closer to the second main surface than is the first surface of the first semiconductor region;

selectively forming a plurality of second semiconductor regions of the first conductivity type, in the first semiconductor region at the first surface of the first semiconductor region;

in the transistor portion, forming a gate insulating film having a first surface and a second surface that are opposite to each other, the first surface of the gate insulating film being in contact with the first semiconductor region; and forming a gate electrode on the second surface of the gate insulating film;

forming a first electrode on the first surface of the first semiconductor region and surfaces of the second semiconductor regions in the transistor portion and on the first surface of the first semiconductor region in the diode portion;

implanting an impurity of the second conductivity type from the second main surface of the semiconductor substrate and forming a third semiconductor region of the second conductivity type;

implanting an impurity of the first conductivity type and forming a fourth semiconductor region of the first conductivity type in the third semiconductor region corresponding to the diode portion;

implanting an impurity of the first conductivity type from the second main surface of the semiconductor substrate and forming a first semiconductor layer of the first conductivity type after forming the fourth semiconductor region but before an annealing treatment; and forming a second electrode on surfaces of the third semiconductor region and the fourth semiconductor region.

9. The method according to claim 8, wherein
the impurity implanted to form the third semiconductor region is boron (B) and the impurity implanted to form the fourth semiconductor region is phosphorus (P) or arsenic (As).

10. A method of manufacturing a semiconductor device having a transistor portion and a diode portion, the method comprising:

preparing a semiconductor substrate having a first main surface and a second main surface that are opposite to each other;

forming a first semiconductor region of a second conductivity type, in the semiconductor substrate, closer to the first main surface than to the second main surface, the first semiconductor region having a first surface and a second surface that are opposite to each other, the second surface of the first semiconductor region being closer to the second main surface than is the first surface of the first semiconductor region;

selectively forming a plurality of second semiconductor regions of the first conductivity type, in the first semiconductor region at the first surface of the first semiconductor region;

in the transistor portion, forming a gate insulating film having a first surface and a second surface that are opposite to each other, the first surface of the gate insulating film being in contact with the first semiconductor region; and forming a gate electrode on the second surface of the gate insulating film;

forming a first electrode on surfaces of the second semiconductor regions and the first surface of the first semiconductor region in the transistor portion and on the first surface of the first semiconductor region in the diode portion;

implanting an impurity of the second conductivity type from the second main surface of the semiconductor substrate and forming a third semiconductor region of the second conductivity type;

performing a laser annealing for activating the third semiconductor region, a first intensity of the laser annealing for the third semiconductor region corresponding to the diode portion being weaker than a second intensity of the laser annealing for the third semiconductor region corresponding to the transistor portion;

implanting an impurity of the first conductivity type from the second main surface of the semiconductor substrate and forming a first semiconductor layer of the first conductivity type;

implanting an impurity of the first conductivity type and forming a fourth semiconductor region of the first conductivity type in the third semiconductor region corresponding to the diode portion; and forming a second electrode on a surface of the third semiconductor region and a surface of the fourth semiconductor region.

11. A method of manufacturing a semiconductor device having a transistor portion and a diode portion, the method comprising:

preparing a semiconductor substrate having a first main surface and a second main surface that are opposite to each other;

forming a first semiconductor region of a second conductivity type, in the semiconductor substrate, closer to the first main surface than to the second main surface, the first semiconductor region having a first surface and a second surface that are opposite to each other, the second surface of the first semiconductor region being closer to the second main surface than is the first surface of the first semiconductor region;

selectively forming a plurality of second semiconductor regions of the first conductivity type, in the first semiconductor region at the first surface of the first semiconductor region;

in the transistor portion, forming a gate insulating film having a first surface and a second surface that are opposite to each other, the first surface of the gate insulating film being in contact with the first semiconductor region; and forming a gate electrode on the second surface of the gate insulating film;

forming a first electrode on surfaces of the second semiconductor regions and the first surface of the first semiconductor region in the transistor portion and on the first surface of the first semiconductor region in the diode portion;

implanting an impurity of the second conductivity type from the second main surface of the semiconductor substrate and forming a third semiconductor region of the second conductivity type;

implanting an impurity of the first conductivity type and forming a fourth semiconductor region of the first conductivity type in the third semiconductor region corresponding to the diode portion;

performing a laser annealing for activating the third semiconductor region and the fourth semiconductor region, a first intensity of the laser annealing for the fourth semiconductor region being weaker than a second intensity of the laser annealing for the third semiconductor region;

implanting an impurity of the first conductivity type from the second main surface of the semiconductor substrate and forming a first semiconductor layer of the first conductivity type; and forming a second electrode on a surface of the third semiconductor region and a surface of the fourth semiconductor region.

\* \* \* \* \*